US012805057B2

(12) United States Patent
Zhong et al.

(10) Patent No.: US 12,805,057 B2
(45) Date of Patent: Nov. 17, 2026

(54) PREPARATION METHOD OF ELECTRODE GRID LINES, AND PHOTOVOLTAIC (PV) CELL

(71) Applicant: BEIJING ZENITHNANO TECHNOLOGY CO., LTD., Beijing (CN)

(72) Inventors: Shudong Zhong, Beijing (CN); Kaiqi Pan, Beijing (CN); Zhicong Li, Beijing (CN); Guanghang Yang, Beijing (CN); Jingjing Shu, Beijing (CN)

(73) Assignee: BEIJING ZENITHNANO TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 19/206,122

(22) Filed: May 13, 2025

(65) Prior Publication Data

US 2026/0096244 A1 Apr. 2, 2026

Related U.S. Application Data

(63) Continuation-in-part of application No. PCT/CN2024/136657, filed on Dec. 4, 2024.

(30) Foreign Application Priority Data

| | | |
|---|---|---|
| Sep. 29, 2024 | (CN) | 202411372309.3 |
| Sep. 29, 2024 | (CN) | 202411372710.7 |
| Sep. 29, 2024 | (CN) | 202411372762.4 |

(51) Int. Cl.

| | |
|---|---|
| ***H10F 77/20*** | (2025.01) |
| ***H10F 10/10*** | (2025.01) |
| ***H10F 71/00*** | (2025.01) |

(52) U.S. Cl.
CPC ........... *H10F 77/215* (2025.01); *H10F 10/10* (2025.01); *H10F 71/128* (2025.01)

(58) Field of Classification Search
CPC ....... H05K 3/007; H10F 77/211; H10F 71/00; B41M 5/502; H10W 90/00; H10W 20/20; H10W 70/093; H10W 90/724
See application file for complete search history.

(56) References Cited

U.S. PATENT DOCUMENTS

| | | | | |
|---|---|---|---|---|
| 5,201,268 A * | 4/1993 | Yamamoto ............ | H01J 9/2278 101/170 |
| 5,609,704 A * | 3/1997 | Hayama ................ | H05K 3/207 156/289 |

(Continued)

FOREIGN PATENT DOCUMENTS

| | | |
|---|---|---|
| CN | 105742380 A | 7/2016 |
| CN | 109496461 A | 3/2019 |

(Continued)

*Primary Examiner* — Jarrett J Stark
(74) *Attorney, Agent, or Firm* — Bayramoglu Law Offices LLC

(57) ABSTRACT

The provided is a preparation method of electrode grid lines and a photovoltaic (PV) cell. The preparation method of electrode grid lines includes: S1: providing a substrate, and forming a polymer layer on the substrate; S2: imprinting a first trench on the polymer layer with a first mold, applying first conductive paste onto the polymer layer, such that the first conductive paste fully fills the first trench, and scraping off excess first conductive paste; S3: providing a base material, covering the base material with the polymer layer, and transfer-printing the polymer layer and the first conductive paste onto the base material at a certain temperature and a certain pressure; S4: peeling off the substrate from the polymer layer, and dissolving the polymer layer, leaving the (Continued)

first conductive paste adhered to the base material; and S5: solidifying or sintering the first conductive paste, and forming electrode grid lines.

15 Claims, 6 Drawing Sheets

(56) References Cited

U.S. PATENT DOCUMENTS 5,992,320 A * 11/1999 Kosaka .................. H01J 9/242 101/401.1
6,374,733 B1 * 4/2002 Hayama ............... H05K 3/4647 438/108
6,378,424 B1 * 4/2002 Hayama ................ B82Y 30/00 101/163
6,429,114 B1 * 8/2002 Hayama .............. H10W 74/012 438/622
7,396,566 B2 * 7/2008 Zschieschang ........ H05K 3/207 427/256
10,645,815 B2 * 5/2020 Landa .................. H10F 71/107
11,877,402 B2 * 1/2024 Landa ................... H05K 1/092
12,446,160 B2 * 10/2025 Landa .................. H05K 1/0393
2002/0056509 A1 * 5/2002 Miura .................... H05K 3/207 156/231
2008/0116615 A1 * 5/2008 Akimoto ................... H01J 9/24 264/227
2008/0233280 A1 * 9/2008 Blanchet ................ B82Y 10/00 428/44
2015/0158323 A1 * 6/2015 Richert .................... C09D 7/68 355/2
2019/0172967 A1 * 6/2019 Landa ................... H10F 77/311
2019/0174634 A1 * 6/2019 Landa ................. H10F 77/1698
2023/0129519 A1 * 4/2023 Cohen .................... B41M 5/465 503/227
2023/0207720 A1 * 6/2023 Cohen ..................... H10F 71/00 136/256
2023/0292445 A1 * 9/2023 Landa ................... H10F 77/215
2024/0381538 A1 * 11/2024 Trischler ............... G03F 7/0002
2025/0343344 A1 * 11/2025 Cho ..................... H01Q 9/0407

FOREIGN PATENT DOCUMENTS

CN 118099236 A 5/2024
WO 2023102778 A1 6/2023

* cited by examiner

PREPARATION METHOD OF ELECTRODE GRID LINES, AND PHOTOVOLTAIC (PV) CELL

CROSS-REFERENCE TO THE RELATED APPLICATIONS

This application is a continuation-in-part application of International Application No. PCT/CN2024/136657, filed on Dec. 4, 2024, which is based upon and claims priority to Chinese Patent Application No. 202411372309.3, filed on Sep. 29, 2024; Chinese Patent Application No. 202411372710.7, filed on Sep. 29, 2024; and Chinese Patent Application No. 202411372762.4, filed on Sep. 29, 2024, the entire contents of which are incorporated herein by reference.

TECHNICAL FIELD

The present disclosure relates to the field of photovoltaic (PV) technologies, and in particular to a preparation method of electrode grid lines, and a PV cell.

BACKGROUND

In the fabrication of PV cells, printing of an electrode grid line is a critical production process. Existing printing technologies for the electrode grid line include screen printing, inkjet printing, offset printing, flexographic printing, etc. Screen printing has been widely applied to production of the PV cells. Through a mesh screen, conductive paste (such as silver paste) is printed onto a silicon wafer to form an electrode pattern. In spite of mature process, low production cost, and applicability for large-scale industrial production, the screen printing cannot achieve high-resolution and fine patterns. This results in excess electrode linewidth, undesirable light absorption and more silver paste consumption, and imposes stringent requirements on cleanliness. Besides, the screen printing has a relatively slow production speed to affect production efficiency.

The inkjet printing is a contactless printing technology. Through a printhead, conductive ink is jetted accurately to a surface of the cell to form an electrode pattern. This technology can realize the higher-resolution and finer electrode patterns, reduces the shading area, improves the photoelectric conversion efficiency, and reduces the waste of conductive paste. However, the inkjet printing imposes relatively high requirements on the equipment and process, particularly the accuracy and durability of the printhead, and rheological properties of the ink, and is to be further optimized for the large-scale production.

By transferring conductive paste to the surface of the cell through a blanket cylinder, the offset printing is suitable for printing of high-precision and complex patterns. With a flexographic plate for large-area continuous printing, the flexographic printing is suitable for fabrication of thin-film solar cells or flexible PV modules. In spite of advantages in resolution and pattern complexity, the offset printing and the flexographic printing are mainly applied to special types of PV cells for the complex process and high equipment and operation cost, and haven't yet been widely applied to the mainstream silicon solar cells.

Therefore, to develop a technology for printing the electrode grid line of the PV cell with the simple process, low cost and high resolution is an important issue to be solvent urgently at present.

SUMMARY

In order to develop a technology for printing the electrode grid lines of the PV cell with the simple process, low cost and high resolution, the present disclosure provides a preparation method of electrode grid lines, and a PV cell.

A preparation method of electrode grid lines includes the following steps:

- S1: providing a substrate, and forming a polymer layer on the substrate;
- S2: imprinting, on the polymer layer with a first mold, first trenches corresponding to a desired electrode pattern, applying first conductive paste onto the polymer layer, such that the first conductive paste fully fills the first trench, and scraping off excess first conductive paste;
- S3: providing a base material, covering the base material with the polymer layer, and transfer-printing the polymer layer and the first conductive paste onto the base material at a certain temperature and a certain pressure;
- S4: peeling off the substrate from the polymer layer, and dissolving the polymer layer, leaving the first conductive paste adhered to the base material; and
- S5: solidifying or sintering the first conductive paste to form electrode grid lines.

In a specific implementable solution, the polymer layer has a thickness of 5-30 μm, and the electrode pattern has an aperture width of 3-10 μm.

In a specific implementable solution, the preparation method of electrode grid lines further includes a step S20 between the step S2 and the step S3: providing a second mold, imprinting second trenches on the first conductive paste with the second mold, and drying the first conductive paste; and applying a second conductive paste onto the first conductive paste, such that the second conductive paste fully fills the second trench, and scraping off excess second conductive paste.

In a specific implementable solution, a contact resistance of the second conductive paste is less than a contact resistance of the first conductive paste; and an electrical conductivity of the second conductive paste is greater than an electrical conductivity of the first conductive paste.

In a specific implementable solution, in the step S20, after the second trenches are imprinted, the first conductive paste is dried at a temperature of 80-200 °C.

In a specific implementable solution, in the step S3, by applying a pressure of 1-20 MPa, and a temperature of 80-180 °C, the first conductive paste is bonded to the base material, or the second conductive paste is bonded to the base material.

In a specific implementable solution, in the step S4, the polymer layer is dissolved with ambient-temperature water, leaving the first conductive paste adhered to the base material, or leaving the first conductive paste and the second conductive paste adhered to the base material.

In a specific implementable solution, in the step S5, the first conductive paste is solidified or sintered at a temperature of 200-1000 °C to form the electrode grid lines, or the first conductive paste and the second conductive paste are solidified or sintered at a temperature of 200-1000 °C to form the electrode grid lines.

In a specific implementable solution, a width of the first trench is the same as a width of the second trench; and a ratio of a height of the first trench to a height of the second trench is 2:1 to 5:1;

- the first trench and the second trench are hot-embossed, and a hot-embossing temperature is 80-180 °C; and a longitudinal section of each of the first trench and the second trench is in the shape of one of a triangle, a trapezoid, a rectangle, a rhombus, a semicircle, and a polygon.

According to the above technical solution,

In a specific implementable solution, a material of each of the first mold and the second mold is one of monocrystalline silicon, polycrystalline silicon, copper, nickel, copper-nickel alloy, nickel-iron alloy, iron-aluminum alloy, and aluminum alloy.

In a specific implementable solution, a glass transition temperature (Tg) of the polymer layer is 70-120 °C, and a material of the polymer layer is a water-soluble polymer material; and the water-soluble polymer material is one of polyvinyl alcohol (PVA), polyvinylpyrrolidone (PVP), polyethylene glycol (PEG), modified polyvinyl alcohol (MPVA), sodium polyacrylate (PAAS), polyvinyl alcohol-polyacrylic acid (PVA-PAA), and polyvinyl alcohol-polyacrylonitrile (PVA-PAN).

In a specific implementable solution, a material of the substrate includes one of polyethylene terephthalate (PET), polyimide (PI), polyethylene terephthalate glycol (PETG), polycarbonate (PC), polypropylene (PP), and polyurethane (PU), and the substrate has a thickness of 25-200 μm.

In a specific implementable solution, the base material is one of a monocrystalline silicon base material, a polycrystalline silicon base material, a perovskite base material, a glass base material, and a plastic base material.

A preparation method of electrode grid lines includes the following steps:

S1: providing a transfer printing film having a composite conductive paste;

S2: providing a base material, aligning and bonding a side having the composite conductive paste, of the transfer printing film to the base material, and transfer-printing the composite conductive paste onto the base material through an imprinting method with a preset process parameter, where the process parameter of the imprinting method includes a pressure of 1-20 MPa, a temperature of 80-180 °C, and a duration of 0.5-10 min;

S3: removing the transfer printing film to retain the composite conductive paste on the base material; and S4: solidifying or sintering the composite conductive paste on the base material, and forming electrode grid lines having a preset aspect ratio.

In a specific implementable solution, a preparation method of the transfer printing film in the step S1 includes the following steps:

S11: providing a polymer layer, and imprinting, on the polymer layer with a first mold, first trenches corresponding to a desired electrode pattern;

S12: applying first conductive paste onto an imprinting formed side of the polymer layer to at least completely fill the first trench, and removing excess first conductive paste on a surface of the polymer layer, such that a surface of the first trench is coplanar with a surface of the first conductive paste;

S13: performing imprinting on the first conductive paste with a second mold to form second trenches of a preset shape, followed by removing the overflowed first conductive paste; and S14: applying second conductive paste into the second trench, covering the first conductive paste with the second conductive paste, and removing excess second conductive paste on the surface of the polymer layer, thereby completing preparation of the transfer printing film having the composite conductive paste.

In a specific implementable solution, before the step S11, the preparation method of the transfer printing film further includes: preparing, with an electrostatic spinning method or a flatbed coating method, the polymer layer having a thickness of 20-125 μm; and the polymer layer has a width of 200-800 μm, a breaking elongation of 20-60%, a tensile strength of 1-20 MPa, and a Shore A hardness of greater than 70 HS.

In a specific implementable solution, the polymer layer includes a water-soluble polymer material; and the water-soluble polymer material is one of PVA, MPVA, PAAS, PVA-PAA, PVA-PAN, PVP, or PEG.

In a specific implementable solution, the step S11 specifically includes: placing the prepared polymer layer into the first mold through a precise hot-embossing machine, and performing hot embossing at a temperature of 80-180 °C, such that the first trench of a micrometer scale or even a nanometer scale corresponding to the electrode pattern is formed on the surface of the polymer layer; and a protrusion of the first mold is complementary in terms of shape to the first trench; and the first trench is in the shape of one of an isosceles triangle, an isosceles trapezoid, an ellipse, a hexagon, a right trapezoid, or a rectangle.

In a specific implementable solution, the step S12 specifically includes: uniformly applying the first conductive paste onto the hot-embossed polymer layer with a flatbed coating method, such that the first conductive paste completely fills the first trench, and scraping off excess first conductive paste to ensure that the first conductive paste is filled fully and distributed uniformly, without deformation.

In a specific implementable solution, the step S13 specifically includes: imprinting, with the second mold according to a preset requirement, the second trench having a height of 2-5 μm, and a width of 5 μm, and drying the first conductive paste at 80-200 °C.

In a specific implementable solution, the step S14 specifically includes: bringing the applied second conductive paste into intimate contact with the formed first conductive paste, to form a robust composite layer; and allowing, by heating or applying a pressure, the conductive paste to fuse mutually, ensuring that a composite layer is void-free, and forming a continuous conductive path.

In a specific implementable solution, the step S14 further includes: after excess paste is removed, drying the conductive paste preliminarily at 80-200 °C for 10-20 min, such that a solvent in the paste is volatilized, and the first conductive paste and the second conductive paste may be bonded completely.

In a specific implementable solution, the first conductive paste is one of copper paste, chromium paste, tin paste, indium paste, nickel paste, titanium paste, and tantalum paste; and the second conductive paste is silver paste; the silver paste further includes of pure silver particles, copper or nickel particles coated with silver; and the silver paste includes a binder; and the binder is phenolic resin or epoxy resin.

In a specific implementable solution, the step S2 specifically includes:

transfer-printing the first conductive paste and the second conductive paste onto the base material via hot embossing by applying a uniform-codirectional pressure and preset temperature, while drying the first conductive paste and the second conductive paste such that the first conductive paste and the second conductive paste are tightly bonded to a surface of the base material, without deformation; and the base material is one of a monocrystalline silicon base material, a polycrystalline silicon base material, a perovskite base material, a glass base material, and a plastic base material.

In a specific implementable solution, the step S3 specifically includes: immersing the transfer-printed base material into water at 25-75 °C for cleaning, such that the polymer layer is dissolved and separated, leaving a successfully transfer-printed pattern of the composite conductive paste of first conductive paste and a second conductive paste to form a basic structure of the electrode grid lines.

In a specific implementable solution, the step S4 specifically includes: placing the base material transfer-printed with first conductive paste and a second conductive paste into a high-temperature furnace, and solidifying or sintering the composite conductive paste at a temperature of 200-1000 °C, ensuring that the first conductive paste and the second conductive paste are solidified or sintered completely, and tightly bonded to the base material to form the electrode grid lines of the preset aspect ratio.

A PV cell includes the electrode grid lines prepared with the preparation method.

In a specific implementable solution, an outer edge of the electrode grid line is in the shape of one of a triangle, a trapezoid, a rectangle, a rhombus, a semicircle, and a polygon; and the electrode grid line has an aspect ratio of 2:1.

In conclusion, the present disclosure has at least one of the following beneficial technical effects: With the trench template and triangular electrode pattern fabricated by hot embossing, the present disclosure realizes the high-resolution electrode pattern, thereby achieving the more dedicated and consistent electrode grid line, and significantly improving the photoelectric conversion efficiency. With the flatbed coating, the present disclosure ensures that the conductive material uniformly fills the trench, and excess material is scraped off effectively, thereby effectively reducing the material waste. In addition, in the transfer printing, by applying the pressure, the conductive material can be accurately transferred to the base material to keep the accuracy of the electrode pattern, which improves uniformity and stability of the electrode, and guarantees excellent electrical performance. Compared with the conventional electrode preparation process, the method simplifies the production process, and omits multiple complex steps and equipment requirements. In combination with technologies such as flatbed coating, high-precision transfer printing, water dissolution and high-temperature sintering, the production process becomes more efficient, and can meet requirements in large-scale production. The high-temperature sintering further ensures the stability and durability of the conductive material to improve the reliability and performance of the electrode.

Figure 1:
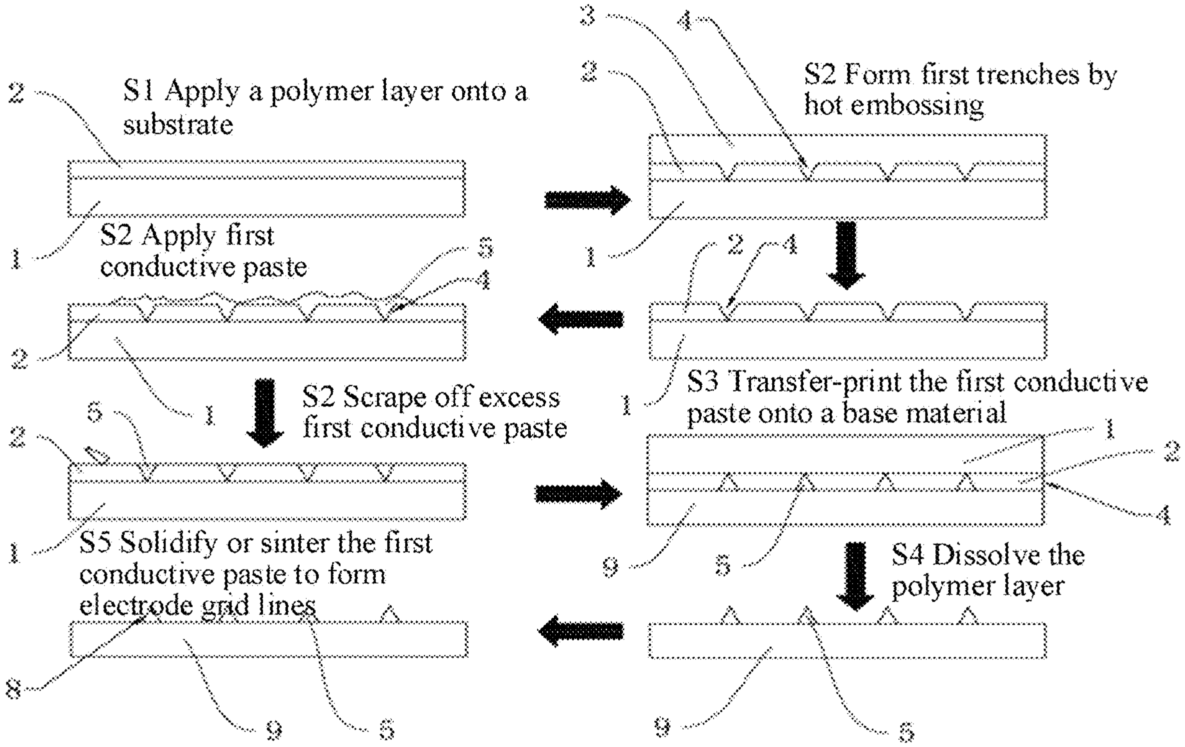
FIG. 1 is a schematic process flowchart of a preparation method of electrode grid lines according to Embodiment 1.

Reference numerals: 1: substrate, 2: polymer layer, 3: first mold, 4: first trench, 5: first conductive paste, 6: second mold, 7: second trench, 8: second conductive paste, 9: base material, 10: electrode grid line, 11: first conductive layer, 12: second conductive layer, and 13: base material layer.

DETAILED DESCRIPTION OF THE EMBODIMENTS

The present disclosure will be further described in detail below with reference to FIGS. 1-8.

Embodiment 1

Figure 2:
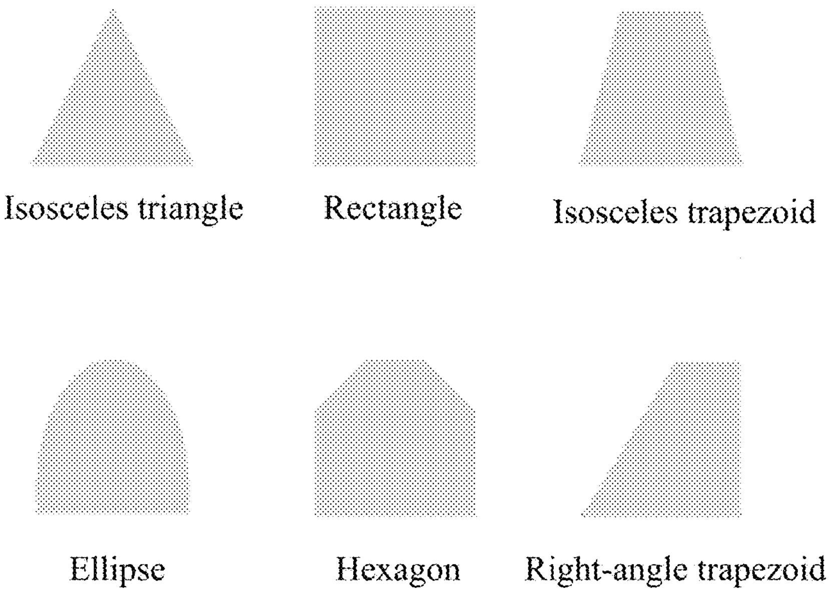
FIG. 2 is a diagram for showing a longitudinal section of the electrode grid line according to Embodiment 1.

Referring to FIG. 1 and FIG. 2, the embodiment of the present disclosure provides a preparation method of electrode grid lines. The method includes the following steps:

S1: Substrate 1 is provided, and polymer layer 2 is formed on the substrate 1. In this process, a surface of the substrate 1 should be clean and flat, so as to guarantee quality of the subsequent coating process. Surface treatment is performed on the substrate 1 to enhance adhesion for the polymer layer 2. The substrate 1 has a thickness of 25-200 μm. In the embodiment, preferably, the substrate 1 has the thickness of 50 μm. A material of the substrate 1 includes, but is not limited to, PET, PI, PETG, PC, PP, and PU. In the embodiment, preferably, the material of the substrate 1 is the PI. The PI exhibits desirable thermal stability to withstand a high temperature up to 400 °C, and possesses high strength and toughness to provide desirable structural support and durability. Moreover, it demonstrates strong resistance to various chemicals, and can keep stable in various environments.

Before the coating, necessary pretreatment is performed on the substrate 1. The pretreatment method includes cleaning, drying and surface activation, so as to remove the pollutant on the surface of the substrate 1, increase the surface roughness, and improve the adhesion for the polymer layer 2.

In the embodiment, this step includes, but is not limited to, that the polymer layer 2 is formed on the substrate 1 by flatbed coating. Specifically, a homogeneous polymer solution is applied on the substrate 1, with uniformity and a thickness controlled. Upon the coating, this step includes, but is not limited to, drying or solidification on the polymer layer 2 at 50-100 °C, so as to ensure that physical and chemical properties of the polymer layer meet requirements. In the embodiment, according to the properties and application requirements of the polymer, further drying, including but not limited to heating in an oven, may be performed, such that the polymer layer 2 is further hardened for the convenience of long-term storage.

The polymer layer 2 has a thickness of 5-30 μm. In the embodiment, preferably, the polymer layer 2 has the thickness of 15±2 μm. The polymer layer 2 with this thickness can achieve a tradeoff among the strength, flexibility and conductivity, making it suited for diverse application requirements. Furthermore, the thin-layer design of the polymer layer 2 reduces the material waste and is applicable to high-density integrated electronic equipment or microstructures.

In the embodiment, a Tg of the polymer layer 2 is 70-120 °C, and a material of the polymer layer 2 includes, but is not limited to, a water-soluble polymer material. The water-soluble polymer material includes, but is not limited to, one of PVA, PVP, PEG, MPVA, PAAS, PVA-PAA, and PVA-PAN. In the embodiment, preferably, the water-soluble polymer material is the PVA. The PVA can be heated to 150 °C, but is prone to discoloration and embrittlement when heated to 180 °C. The PVA is insoluble in organic solvents such as gasoline, kerosene, plant oil, benzene, toluene, dichloroethane, carbon tetrachloride, acetone, ethyl acetate, methanol, and ethylene glycol. The PVA is soluble in water, such that coating and film-forming processes are more convenient, without complex solvent treatment. Moreover, the water-soluble PVA is cleaned easily after use to reduce the environmental burden.

In the embodiment, through adjustment on an alcoholysis degree of the PVA or blending modification, the water solubility of the PVA can be changed, such that the PVA is dissolved quickly at an ambient temperature.

Specifically, increasing the alcoholysis degree of the PVA (the degree of alcoholysis of the PVA) can improve a dissolution velocity of the PVA in the water, resulting in that the PVA is permeated and dissociated more easily by water molecules to accelerate the dissolution process. Blending the PVA with other water-soluble polymers or additives can improve the water solubility of the PVA. For example, when the PVA is blended with a hydrophilic polymer, the solubility and dissolution rate of the PVA can be enhanced. By optimizing a blending ratio and selecting an appropriate modifier, the dissolving property of the PVA can be adjusted to meet special application requirements.

S2: First trenches 4 corresponding to a desired electrode pattern are hot-embossed on the polymer layer 2 with first mold 3 to obtain a template. In the embodiment, a material of the first mold 3 includes, but is not limited to, one of monocrystalline silicon, polycrystalline silicon, copper, nickel, copper-nickel alloy, nickel-iron alloy, iron-aluminum alloy, and aluminum alloy. The polymer layer 2 includes, but is not limited to, the first trench 4 hot-embossed by a hot-embossing machine and corresponding to the electrode pattern.

In the embodiment, the electrode pattern of the polymer layer 2 has an aperture width of 3-10 μm, and an aspect ratio of 2:1. That is, the first trench 4 has a notch width of 3-10 μm, and an aspect ratio of 2:1. In the precise process for fabricating solar electrode grid lines 10, accurate control over both the thickness of the electrode grid line 10 and the width of the patterned aperture is critical. These two parameters directly affect the filling effect of the subsequent conductive material, the dimensional accuracy of the electrode grid line 10 and the performance of the final cell. When the polymer layer 2 has the thickness of 5-30 μm, and the electrode patterned aperture has the width of 3-10 μm, and the aspect ratio of 2:1, the filling efficiency of the subsequent conductive material and the dimensional accuracy of the electrode grid line 10 can be taken into account. With the smaller aperture width, the parasitic resistance between the electrode grid lines 10 is reduced, and the current collection efficiency of the cell is improved. Meanwhile, within the range of the width, the conductive material can be fully and uniformly filled in the aperture to prevent a void or a defect. By accurately controlling the thickness of the polymer layer 2 and the width of the patterned aperture, the dimensional accuracy of the electrode grid line 10 can be improved significantly, thereby reducing performance fluctuation and a defect rate caused by dimensional deviation.

In the embodiment, a hot-embossing temperature on the polymer layer 2 is 80-180 °C, and a hot-embossing pressure is 1-20 MPa. Preferably, an optimal hot-embossing condition includes a hot-embossing temperature of 120-180 °C, a hot-embossing pressure of 10 MPa, and a hot-embossing duration of 2 min. Under this condition, the trench can be hot-embossed desirably.

Specifically, the dried polymer layer 2 is placed on the hot-embossing machine. According to characteristics of the polymer layer 2 and accuracy of the desired electrode pattern, the hot-embossing machine is set at the temperature of 120-180 °C, the pressure of 10 MPa, and the duration of 2 min. The polymer layer 2 can be softened at this temperature. Under this pressure, the pattern of the mold on the hot-embossing machine can be imprinted completely at high accuracy. With this duration, details of the pattern can be replicated accurately. The dried polymer layer 2 is placed on a heating plate of the hot-embossing machine. Then, the first mold 3 is aligned and pressed down. The heating plate is heated to a preset temperature. The first mold 3 is pressed into the polymer layer 2 under a pressure of the heating plate, so as to form the first trenches 4 corresponding to the desired electrode pattern. Upon the hot embossing, the mold and the polymer layer 2 are cooled to the ambient temperature. In the cooling process, the polymer layer 2 is allowed to maintain its shape in the mold, such that the shape and size of the first trench 4 are stabilized. Upon cooling, the first mold 3 is carefully taken down from the polymer layer 2. The pattern of the first trench 4 is clear, and matches with the desired electrode pattern. Careful inspection is made to determine whether the shape and size of the first trench 4 meet requirements of the electrode pattern of the micrometer scale or even the nanometer scale. If necessary, after treatment is performed on the first trench. For example, the first trench may be cleaned to remove residues, or further subjected to fine treatment to meet requirements of the subsequent process.

In this process, the hot-embossing temperature is above a Tg of the PVA and below a melting point of the PVA, which prevents discoloration and embrittlement of the polymer layer 2 in the hot embossing to ensure the processability, stability, and uniformity of the material. Under the above optimal hot-embossing condition, the polymer layer 2 can be shaped better to form the accurate trench, thereby improving the processing accuracy and final product quality. By controlling the hot-embossing temperature within a safe range, a thermal stress caused by an overhigh temperature is reduced, thereby reducing thermal injury to the material.

The first trench 4 corresponds to the electrode grid line 10 in shape and size. In actual operation, the size and shape of the electrode grid line 10 to be transfer-printed are controlled to reduce an ohmic loss of the electrode grid line 10. A longitudinal section of the first trench 4 is in the shape including but not limited to a triangle, a trapezoid, a rectangle, a rhombus, a semicircle, and a polygon. In the embodiment, preferably, the longitudinal section of the first trench 4 is in the shape of the triangle. The triangular longitudinal section facilitates change of incident and refractive paths of the light, can capture and guide the light better, and can effectively reduce the reflective loss of the light, such that more light is absorbed by the semiconductor material and converted into electric energy, thereby improving the photoelectric conversion efficiency.

S3: First conductive paste 5 is applied onto the polymer layer 2 by flatbed coating, such that the first conductive paste 5 fully fills the first trench 4. Excess first conductive paste 5 is scraped off.

Specifically, on the polymer layer 2 formed with the first trenches 4, the first conductive paste 5 is applied uniformly by the flatbed coating. The appropriate first conductive paste 5 is selected. A flatbed coater or a blade coating tool is used for coating. The first conductive paste 5 is applied uniformly onto the polymer layer 2, ensuring that the material can fully fill all voids in the first trench 4, and cover the whole surface of the first trench. Upon the coating, the excess first conductive paste 5 is scraped off with a doctor blade or other tools, ensuring that the first conductive paste 5 in the first trench 4 is leveled and tightly bonded to the polymer layer 2.

In the embodiment, the first conductive paste 5 includes, but is not limited to, silver paste. The silver paste further includes of pure silver particles, copper or nickel particles coated with silver. The silver paste includes a binder. The binder is phenolic resin or epoxy resin. The binder is used to enhance bonding between particles of the silver paste. In the embodiment, the binder has a shear strength of 10-30 MPa, with excellent bonding performance and chemical resistance.

The binder can effectively enhance a bonding force between the silver particles in the silver paste, thereby reducing disruption of a conductive path in the silver paste and improving the electrical conductivity.

The polymer layer 2 of the PVA is incompatible and nonreactive with the binder of the silver paste. With the nonreactive property, the PVA and the silver paste are not chemically changed or degraded to keep respective properties stable. This can ensure that the materials play the optimal effect in expected applications, without mutual influence.

Moreover, the processed polymer layer 2 can be removed easily through the water solubility, without compromising performance of the silver paste.

S4: Base material 9 is covered with the substrate 1 having the first conductive paste 5 and the polymer layer 2, and the polymer layer 2 and the first conductive paste 5 are adhered to the base material 9 at a certain temperature and a certain pressure. This step includes, but is not limited to, that the polymer layer 2 and the first conductive paste 5 are adhered to the base material 9 under a high temperature of 80-180 °C and a pressure of 1-20 MPa. In the embodiment, preferably, an optimal hot-embossing transfer condition includes a hot-embossing temperature of 120-180 °C, a hot-embossing pressure of 10 MPa, and a hot-embossing duration of 8 min. Under this condition, the first conductive paste 5 and the polymer layer 2 can be adhered to the base material 9 desirably, the first conductive paste 5 is morphologically intact without deformation, and the polymer layer 2 and the substrate 1 can be peeled off desirably.

Specifically, a surface of the base material 9 is cleaned to remove any pollutant or particle, ensuring that the surface of the base material 9 is clean and flat. The base material 9 is covered with the polymer layer 2 coated with the first conductive paste 5, ensuring that a pattern of the first conductive paste 5 is aligned at a position on the base material 9. To improve alignment accuracy, an alignment tool or a visual alignment system may be used.

The polymer layer is placed slightly on base material 9, ensuring that each portion of the first conductive paste 5 comes in intimate contact with the surface of the base material 9. At the pressure of 10 MPa and the hot-embossing temperature of 120-180 °C, the first conductive paste 5 is pressed onto the base material 9. The pressure should be distributed uniformly to ensure that the first conductive paste 5 is bonded completely to form the clear pattern. In this step, the pressure should be applied uniformly to ensure accurate transfer printing of the first conductive paste 5. After the pressure is applied, the first conductive paste and the base material 9 are hot-embossed for 8 min, to ensure that the first conductive paste 5 comes in full contact and adhesion to the base material 9.

In the embodiment, the binder in the silver paste can further enhance bonding between the particle of the silver paste as the first conductive paste 5 and the base material 9. Upon hot-embossing transfer, the first conductive paste 5 and the polymer layer 2 are tightly adhered to the base material 9. The substrate 1 at the other side can be easily peeled off from the polymer layer 2. The binder in the silver paste can promote the adhesion between the particle in the silver paste and the base material 9, improve a bonding strength between the first conductive paste 5 and the base material 9, and further optimize the conductive performance, while improving the overall durability and reliability.

S5: The substrate 1 is peeled off from the polymer layer 2, and the polymer layer 2 is dissolved, leaving the first conductive paste 5 adhered to the base material 9. The base material 9 includes, but is not limited to, one of monocrystalline silicon base material 9, polycrystalline silicon base material 9, perovskite base material 9, glass base material 9, and plastic base material 9. In the embodiment, the base material 9 is the polycrystalline silicon base material 9. The polycrystalline silicon base material 9 exhibits excellent electrical conductivity and stability, along with superior thermal stability and thermal conductivity, making it suitable for fabrication of various electronic devices and applicable to the PV cell in the present disclosure.

Specifically, upon the transfer printing, the substrate 1 is peeled off from the polymer layer 2 first, and then the polymer layer 2 is dissolved with ambient-temperature water. In the embodiment, a temperature of the ambient-temperature water includes, but is not limited to, 20-25 °C. After the substrate 1 is peeled off, the polymer layer 2 coated with the first conductive paste 5 is immersed into a container filled with the ambient-temperature water. The temperature of the water should be maintained at a room temperature of 20-25 °C, so as not to cause thermal injury to the first conductive paste 5 or the base material 9. During immersion, the polymer layer 2 is gradually dissolved in the water.

In order to dissolve the polymer layer 2 completely, the water may be stirred moderately or the temperature of the water is increased to promote the uniform dissolution process. A duration in this process depends on the thickness and material properties of the polymer layer 2. During this process, the dissolving condition of the polymer layer 2 should be inspected regularly to ensure complete dissolution of the polymer layer. When the polymer layer 2 is dissolved completely, the pattern of the first conductive paste 5 on the surface of the polymer layer 2 is retained on the base material 9 completely.

In order to further ensure the adhesion and stability of the first conductive paste 5, the surface of the base material 9 may be rinsed with clean water to remove possible particulate residues from the polymer layer 2. At last, the transfer-printed base material 9 is air-dried or dried using other methods for next treatment.

S5: The first conductive paste 5 is solidified or sintered to form the electrode grid lines 10 on the base material 9. In the embodiment, this step includes, but is not limited to, that the conductive material is solidified or sintered at a temperature of 200-1000 °C.

Specifically, the base material 9 coated with the first conductive paste 5 is placed into a heating furnace or a drying oven and solidified or sintered at a temperature of 200-1000 °C. The temperature and duration in the solidifying or sintering process should be set according to the first conductive paste 5, so as to ensure that the first conductive paste can be solidified or sintered completely at the temperature, without damage on the base material 9. The solidifying or sintering duration should be set according to properties of the first conductive paste 5, ensuring that the material has enough time at the temperature to realize chemical reaction or physical transformation to achieve optimal conductive performance and adhesion. Upon solidifying or sintering, the base material 9 is naturally cooled to the room temperature, so as not to damage the electrode grid lines 10 for thermal stress. The solidified or sintered electrode grid lines 10 are inspected, ensuring that the pattern of the electrode grid line is clear with desirable adhesion. Phenomena such as poor conductivity, defect or separation are inspected to ensure that quality of the electrode grid line 10 meets the design requirements.

In this process, if necessary, any residue or pollutant in the solidifying or sintering process is removed. Electrical performance testing may also be conducted to verify whether the conductive performance of the electrode grid line 10 complies with specifications and validate the performance of the electrode grid line in actual applications.

The method in the present disclosure features concise process steps and relatively low material and equipment requirements to effectively reduce the overall production cost. With the hot embossing for fabricating the electrode pattern of the first trench 4, the method realizes the high-resolution electrode pattern, thereby achieving the more dedicated and consistent electrode grid line 10, and significantly improving the photoelectric conversion efficiency. With the flatbed coating, the method ensures that the first conductive paste 5 uniformly fills the first trench 4, and excess material is scraped off effectively, thereby reducing the material waste. In addition, in the transfer printing, by applying the pressure and the temperature, the method ensures that the first conductive paste 5 can be accurately adhered to the base material 9 to keep the accuracy of the electrode pattern, which improves uniformity and stability of the electrode, and guarantees excellent electrical performance. Compared with the conventional electrode preparation process, the method simplifies the production process, and omits multiple complex steps and equipment requirements. In combination with the flatbed coating, high-precision transfer printing, water dissolution and high-temperature sintering, the production process becomes more efficient, and can meet requirements in large-scale production. The high-temperature sintering further ensures the stability and durability of the first conductive paste 5 to improve the reliability and performance of the electrode.

The present disclosure further provides a PV cell, including the electrode grid lines 10 prepared with the above preparation method.

A longitudinal section of the electrode grid line 10 includes, but is not limited to, a triangle, a trapezoid or a semi-ellipse, and may further be a rectangle, a rhombus, and a polygon. The shape of the longitudinal section of the electrode grid line 10 may refer to FIG. 2. FIG. 2 only shows an exemplary shape, and other shapes may also be available. The triangle has a vertex angle of 20-60°, a height of 10±2 μm, a width of 5±1 μm, and an aspect ratio of 2:1. The trapezoid has a base angle of 30-70°, a height of 10±2 μm, a width of 5±1 m, and an aspect ratio of 2:1. The semi-ellipse has a height of 10±2 μm, an aspect ratio of 2:1, and a width of 5±1 μm. The edge of the triangle, the trapezoid and the semi-ellipse can better control a direction of propagation of light to reduce a reflection loss, and increase light absorption. This lengthens a path of the light in the cell to promote the light absorption efficiency.

In the embodiment, the triangle is an isosceles triangle, the trapezoid is an isosceles trapezoid, and the ellipse is a symmetric semi-ellipse. The design of the isosceles triangle, the isosceles trapezoid, and the symmetric semi-ellipse not only reduces the usage of the conductive material, but also enhances the light energy utilization through reflection. The design enables uniform light distribution across the electrode surface, while mitigating the light concentration effect. This improves the light trapping efficiency, facilitates more uniform current distribution, reduces the localized resistance, and improves the current output efficiency of the cell. Furthermore, this can offer better structural stability to ensure the mechanical integrity and long-term reliability of the electrode.

Through the high-precision pattern transfer printing, superior electrode quality, simplified process and optimized electrode design, the PV cell using the electrode grid lines 10 prepared with the preparation method can significantly improve the photoelectric conversion efficiency, lower the fabrication cost, improve the production efficiency, ensure the long-term stability and reliability of the cell, and contribute to application and development of the PV cell.

Embodiment 2

Figure 3:
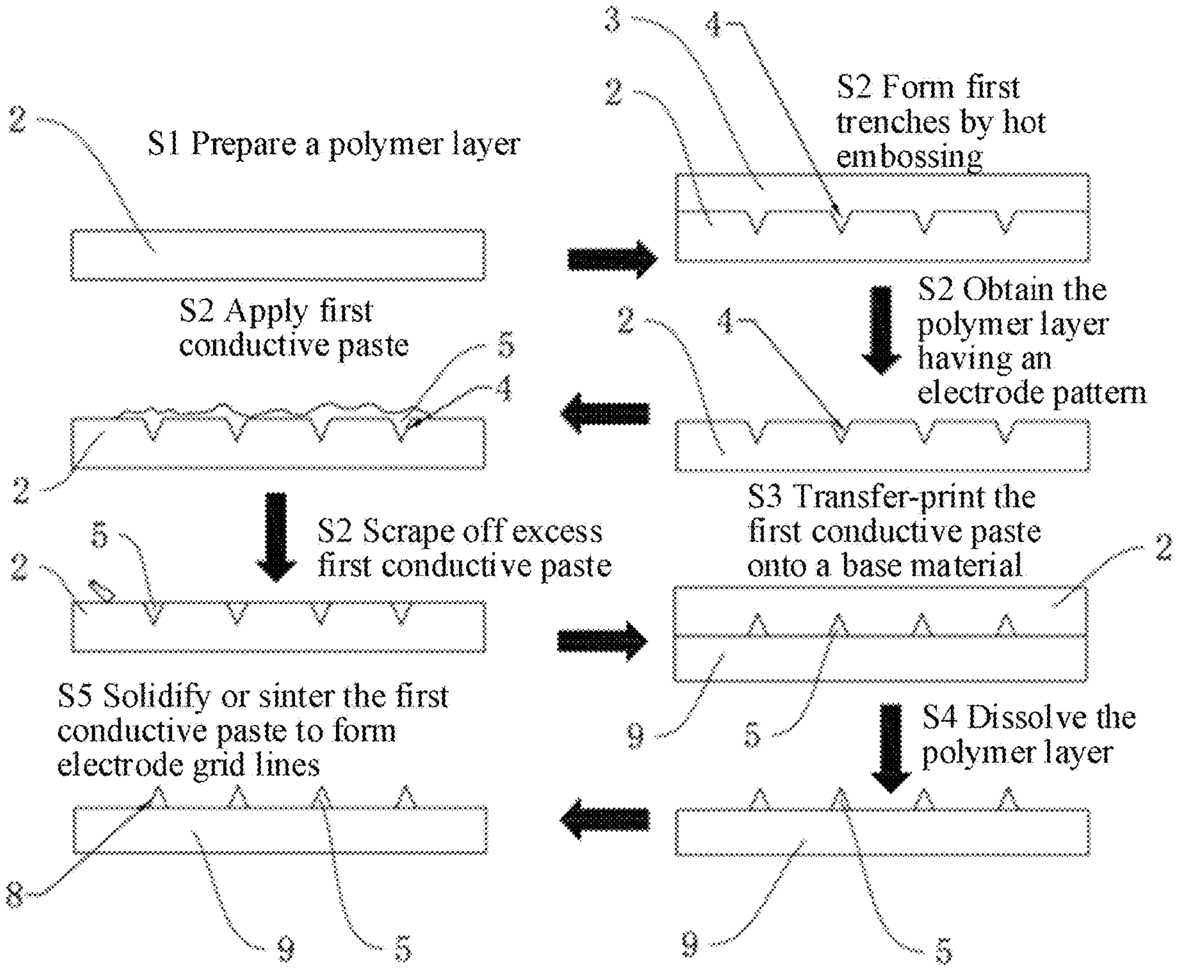
FIG. 3 is a schematic process flowchart of a preparation method of electrode grid lines according to Embodiment 2.
Figure 4:
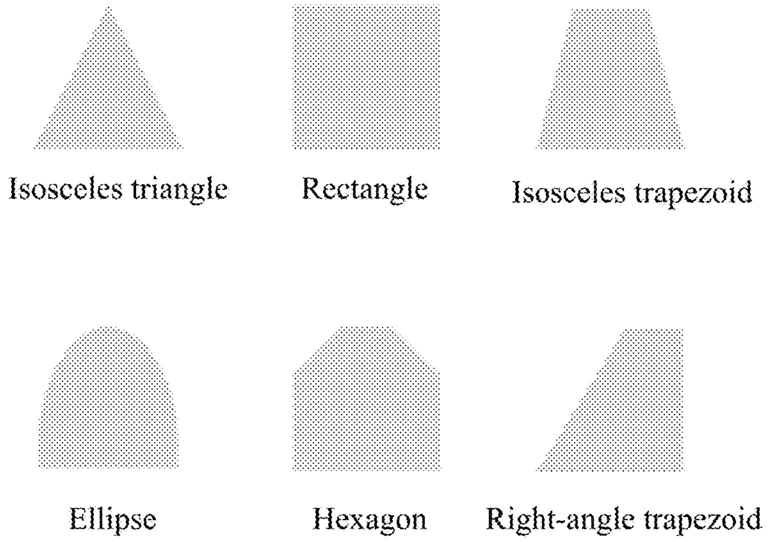
FIG. 4 is a diagram for showing a longitudinal section of the electrode grid line according to Embodiment 2.

Referring to FIG. 3 and FIG. 4, the embodiment differs from Embodiment 1 in: The method includes the following steps:

S1: Polymer layer 2 is provided. In the embodiment, a material of the polymer layer 2 includes, but is not limited to, one of PVA, PVP, PEG, MPVA, PAAS, PVA-PAA, and PVA-PAN. In the embodiment, preferably, the polymer layer 2 includes the PVA. The PVA is soluble in water, such that coating and film-forming processes are more convenient, without complex solvent treatment. Moreover, the water-soluble PVA is cleaned easily after use to reduce the environmental burden.

The polymer layer 2 has a thickness of 25-125 μm. In the embodiment, preferably, the polymer layer 2 has the thickness of 30 μm. The PVA in the polymer layer 2 has a concentration of 12-20 wt %. In the embodiment, preferably, the polymer layer 2 has a concentration of 15 wt %.

In the embodiment, the polymer layer 2 is prepared with a technology including but not limited to flatbed coating. With the optimal PVA as an example, the polymer layer 2 is specifically prepared as follows:

a: A PVA raw material and a solvent are prepared. The solvent includes, but is not limited to, deionized water or a suitable organic solvent. According to an actual need, corresponding additives, such as a plasticizer, a thickener, or other functional materials, may also be selected.

b: The PVA raw material is added to an appropriate amount of the deionized water, followed by heating and stirring, until the PVA raw material is dissolved completely to form a homogeneous PVA solution. A concentration of the PVA solution is adjusted to ensure the concentration of the PVA within 12-20 wt %.

c: The PVA solution is applied on a smooth surface (such as a glass or plastic film), with a thickness controlled. A blade, a brush or a spray gun may be used to control a coating speed and a tool gap to achieve a desired film thickness of 30-125 μm.

d: Drying is performed at a room temperature to remove a part of moisture. The coated PVA layer is placed into a drying oven and dried at 50-100 °C, so as to accelerate drying and solidification. The dried PVA layer can be peeled off from the smooth surface naturally to form a free-standing film, which is the polymer layer 2.

For the polymer layer 2 prepared with the above method, the PVA layer with the thickness of 30-125 μm exhibits desirable tensile strength and flexibility. The PVA with the concentration of 12-20 wt % exhibits excellent solubility in water, facilitating its processing and removal.

In the embodiment, through adjustment on an alcoholysis degree of the PVA or blending modification, the water solubility of the PVA can also be changed, such that the PVA is dissolved quickly at an ambient temperature. Specifically, increasing the alcoholysis degree of the PVA (the degree of alcoholysis of the PVA) can improve a dissolution velocity of the PVA in the water, resulting in that the PVA is permeated and dissociated more easily by water molecules to accelerate the dissolution process. Blending the PVA with other water-soluble polymers or additives can improve the water solubility of the PVA. For example, when the PVA is blended with a hydrophilic polymer, the solubility and dissolution rate of the PVA can be enhanced. By optimizing a blending ratio and selecting an appropriate modifier, the dissolving property of the PVA can be adjusted to meet special application requirements.

S2: First trenches 4 corresponding to a desired electrode pattern are hot-embossed on the polymer layer 2 with first mold 3 to obtain the polymer layer 2 having the electrode pattern. In the embodiment, base material 9 of the first mold 3 includes, but is not limited to, one of monocrystalline silicon base material 9, polycrystalline silicon base material 9, copper base material 9, nickel base material 9, copper-nickel alloy base material 9, nickel-iron alloy base material 9, iron-aluminum alloy base material 9, and aluminum alloy base material 9. The polymer layer 2 includes, but is not limited to, the first trench 4 hot-embossed by a hot-embossing machine.

In the embodiment, the electrode pattern of the polymer layer 2 has an aperture width of 3-10 μm, and an aspect ratio of 2:1. That is, the first trench 4 has a notch width of 3-10 μm, and an aspect ratio of 2:1. In the precise process for fabricating solar electrode grid lines 10, accurate control over both the thickness of the electrode grid line 10 and the width of the patterned aperture is critical. These two parameters directly affect the filling effect of the subsequent first conductive paste 5, the dimensional accuracy of the electrode grid line 10 and the performance of the final cell. When the polymer layer 2 has the thickness of 30-125 μm, and the electrode patterned aperture has the width of 3-10 μm, and the aspect ratio of 2:1, the filling efficiency of the subsequent first conductive paste 5 and the dimensional accuracy of the electrode grid line 10 can be taken into account. With the smaller aperture width, the parasitic resistance between the electrode grid lines 10 is reduced, and the current collection efficiency of the cell is improved. Meanwhile, within the range of the width, the first conductive paste 5 can be fully and uniformly filled in the aperture to prevent a void or a defect. By accurately controlling the thickness of the polymer layer 2 and the width of the patterned aperture, the dimensional accuracy of the electrode grid line 10 can be improved significantly, thereby reducing performance fluctuation and a defect rate caused by dimensional deviation.

In the embodiment, a hot-embossing temperature is 80-180 °C. Preferably, an optimal hot-embossing condition includes a hot-embossing temperature of 120-180 °C, a hot-embossing pressure is 10 MPa, and a hot-embossing duration of 2 min. Under this condition, the first trench 4 can be hot-embossed desirably. In this process, the hot-embossing temperature is above a Tg of the PVA and below a melting point of the PVA, which prevents discoloration and embrittlement of the polymer layer 2 in the hot embossing to ensure the processability, stability, and uniformity of the material. Under the above optimal hot-embossing condition, the polymer layer 2 can be shaped better to form the accurate first trench 4, thereby improving the processing accuracy and final product quality. By controlling the hot-embossing temperature within a safe range, a thermal stress caused by an overhigh temperature is reduced, thereby reducing thermal injury to the material.

Specifically, the dried polymer layer 2 is placed on the hot-embossing machine. According to characteristics of the polymer layer 2 and accuracy of the desired electrode pattern, the hot-embossing machine is set at the temperature of 120-180 °C, the pressure of 10 MPa, and the duration of 2 min. The polymer layer 2 can be softened at this temperature. Under this pressure, the pattern of the first mold 3 on the hot-embossing machine can be imprinted completely at high accuracy. With this duration, details of the pattern can be replicated accurately. The dried polymer layer 2 is placed on a heating plate of the hot-embossing machine. Then, the first mold 3 is aligned and pressed down. The heating plate is heated to a preset temperature. The first mold 3 is pressed into the polymer layer 2 under a pressure of the heating plate, so as to form the first trenches 4 corresponding to the desired electrode pattern. Upon the hot embossing, the first mold 3 and the polymer layer 2 are cooled to the ambient temperature. In the cooling process, the polymer layer 2 is allowed to maintain its shape in the first mold 3, such that the shape and size of the first trench 4 are stabilized. Upon cooling, the first mold 3 is carefully taken down from the polymer layer 2. The pattern of the first trench 4 is clear, and matches with the desired electrode pattern. Careful inspection is made on the hot-embossed polymer layer 2 to determine whether the shape and size of the first trench 4 meet requirements of the electrode pattern of the micrometer scale or even the nanometer scale.

The first trench 4 corresponds to the electrode grid line 10 in shape and size. In actual operation, the size and shape of the electrode grid line 10 to be transfer-printed are controlled to reduce an ohmic loss of the electrode grid line 10. A longitudinal section of the first trench 4 is in the shape including but not limited to a triangle, a trapezoid, a rectangle, a rhombus, a semicircle, and a polygon. In the embodiment, preferably, the longitudinal section of the first trench 4 is in the shape of the triangle or the trapezoid. The triangular or trapezoidal longitudinal section facilitates change of incident and refractive paths of the light, can capture and guide the light better, and can effectively reduce the reflective loss of the light, such that more light is absorbed by the semiconductor material and converted into electric energy, thereby improving the photoelectric conversion efficiency.

First conductive paste 5 is applied onto the polymer layer 2 by flatbed coating, such that the first conductive paste 5 fully fills the first trench 4. The excess first conductive paste 5 is scraped off.

Specifically, on the polymer layer 2 formed with the first trenches 4, the first conductive paste 5 is applied uniformly by the flatbed coating. The appropriate first conductive paste 5 is selected. A flatbed coater or a blade coating tool is used for coating. The first conductive paste 5 is applied uniformly onto the polymer layer 2, ensuring that the material can fully fill all voids in the first trench 4, and cover the whole surface of the first trench. Upon the coating, the excess first conductive paste 5 is scraped off with a doctor blade or other tools, ensuring that the first conductive paste 5 in the first trench 4 is leveled and tightly bonded to the polymer layer 2.

The first conductive paste 5 includes, but is not limited to, silver paste. The silver paste includes a binder. The binder is phenolic resin or epoxy resin. The binder is used to enhance bonding between particles of the silver paste. In the embodiment, the binder has a shear strength of 10-30 MPa, with excellent bonding performance and chemical resistance.

The binder can effectively enhance a bonding force between the silver particles in the silver paste, thereby reducing disruption of a conductive path in the silver paste and improving the electrical conductivity.

The polymer layer 2 of the PVA is incompatible and nonreactive with the binder of the silver paste. With the nonreactive property, the PVA and the silver paste are not chemically changed or degraded to keep respective properties stable. This can ensure that the materials play the optimal effect in expected applications, without mutual influence. Moreover, the processed polymer layer 2 can be removed easily through the water solubility, without compromising performance of the silver paste.

S3: The base material 9 is covered with the polymer layer 2, and the polymer layer 2 and the first conductive paste 5 are adhered to the base material 9 at a certain temperature and a certain pressure. This step includes, but is not limited to, that the polymer layer 2 and the first conductive paste 5 are adhered to the base material 9 through a high temperature of 80-180 °C and a pressure of 1-20 MPa. In the embodiment, preferably, an optimal hot-embossing transfer condition includes a hot-embossing temperature of 120-180 °C, a hot-embossing pressure of 10 MPa, and a hot-embossing duration of 8 min. Under this condition, the first conductive paste 5 and the polymer layer 2 can be adhered to the base material 9 desirably, and the first conductive paste 5 is morphologically intact without deformation.

Specifically, a surface of the base material 9 is cleaned to remove any pollutant or particle, ensuring that the surface of the base material 9 is clean and flat. The base material 9 is covered with the polymer layer 2 coated with the first conductive paste 5. The polymer layer 2 is slightly placed on the base material 9, ensuring that each portion of the first conductive paste 5 on the polymer layer 2 comes in intimate contact with the surface of the base material 9. At the pressure of 10 MPa and the hot-embossing temperature of 120-180 °C, the polymer layer 2 is pressed onto the base material 9. The pressure should be distributed uniformly to ensure that the first conductive paste 5 is bonded completely to form the clear pattern. In this step, the pressure should be applied uniformly to ensure accurate transfer printing of the first conductive paste 5. After the pressure is applied, the polymer layer 2 and the base material 9 are hot-embossed for 8 min, to ensure that the first conductive paste 5 comes in full contact and adhesion to the base material 9.

In the embodiment, the binder can further enhance bonding between the particle of the silver paste and the base material 9. Upon hot-embossing transfer, the silver paste as the first conductive paste 5 and the polymer layer 2 are tightly adhered to the base material 9. By this time, the binder in the silver paste can promote the adhesion between the particle in the silver paste and the base material 9, improve a bonding strength between the first conductive paste 5 and the base material 9, and further optimize the conductive performance, while improving the overall durability and reliability.

S4: The polymer layer 2 is dissolved. After the polymer layer 2 is dissolved, the first conductive paste 5 is left and adhered to the base material 9. The base material 9 includes, but is not limited to, one of monocrystalline silicon base material 9, polycrystalline silicon base material 9, perovskite base material 9, glass base material 9, and plastic base material 9. In the embodiment, the base material 9 is the polycrystalline silicon base material 9. The polycrystalline silicon base material 9 exhibits excellent electrical conductivity and stability, along with superior thermal stability and thermal conductivity, making it suitable for fabrication of various electronic devices and applicable to the PV cell in the present disclosure.

Specifically, upon the transfer printing, the polymer layer 2 is dissolved with ambient-temperature water. In the embodiment, a temperature of the ambient-temperature water includes, but is not limited to, 20-25 °C. First of all, the polymer layer 2 coated with the first conductive paste 5 is immersed into a container filled with the ambient-temperature water. The temperature of the water should be maintained at a room temperature of 20-25 °C, so as not to cause thermal injury to the first conductive paste 5 or the base material 9. During immersion, the polymer layer 2 is gradually dissolved in the water.

In order to dissolve the polymer layer 2 completely, the water may be stirred moderately or the temperature of the water is increased to promote the uniform dissolution process. A duration in this process depends on the thickness and material properties of the polymer layer 2. During this process, the dissolving condition of the polymer layer 2 should be inspected regularly to ensure complete dissolution of the polymer layer. When the polymer layer 2 is dissolved completely, the pattern of the first conductive paste 5 is retained on the base material 9 completely.

In order to further ensure the adhesion and stability of the first conductive paste 5, the surface of the base material 9 may be rinsed with clean water to remove possible particulate residues from the polymer layer 2. At last, the transfer-printed base material 9 is air-dried or dried using other methods for next treatment.

S5: The first conductive paste 5 is solidified or sintered to form the electrode grid lines 10 on the base material 9. In the embodiment, this step includes, but is not limited to, that the conductive material is solidified or sintered at a temperature of 200-1000 °C.

Specifically, the base material 9 coated with the first conductive paste 5 is placed into a heating furnace or a drying oven and solidified or sintered at a temperature of 200-1000 °C. The temperature and duration in the solidifying or sintering process should be set according to the first conductive paste 5, such that the first conductive paste can be solidified or sintered completely at the temperature, without damage on the base material 9. The solidifying or sintering duration should be set according to properties of the first conductive paste 5, ensuring that the material has enough time at the temperature to realize chemical reaction or physical transformation to achieve optimal conductive performance and adhesion. Upon solidifying or sintering, the base material 9 is naturally cooled to the room temperature, so as not to damage the electrode grid lines 10 for thermal stress. The solidified or sintered electrode grid lines 10 are inspected to ensure that the pattern of the electrode grid line is clear with desirable adhesion. Phenomena such as poor conductivity, defect or separation are inspected to ensure that quality of the electrode grid line 10 meets the design requirements.

The present disclosure further provides a PV cell, including the electrode grid lines 10 prepared with the above preparation method.

A longitudinal section of the electrode grid line 10 includes, but is not limited to, a triangle, a trapezoid or a semi-ellipse, and may further be a rectangle, a rhombus, and a polygon. The shape of the longitudinal section of the electrode grid line 10 may refer to FIG. 4. FIG. 4 only shows an exemplary shape, and other shapes may also be available. The triangle has a vertex angle of 20-60°, a height of 10±2 μm, a width of 5±1 μm, and an aspect ratio of 2:1. The trapezoid has a base angle of 30-70°, a height of 10±2 μm, a width of 5±1 μm, and an aspect ratio of 2:1. The semi-ellipse has a height of 10±2 μm, an aspect ratio of 2:1, and a width of 5±1 μm. The edge of the triangle, the trapezoid and the semi-ellipse can better control a direction of propagation of light to reduce a reflection loss, and increase light absorption. This lengthens a path of the light in the cell to promote the light absorption efficiency.

In the embodiment, the triangle is an isosceles triangle, the trapezoid is an isosceles trapezoid, and the ellipse is a symmetric semi-ellipse. The design of the isosceles triangle, the isosceles trapezoid, and the symmetric semi-ellipse not only reduces the usage of the conductive material, but also enhances the light energy utilization through reflection. The design enables uniform light distribution across the electrode surface, while mitigating the light concentration effect. This improves the light trapping efficiency, facilitates more uniform current distribution, reduces the localized resistance, and improves the current output efficiency of the cell. Furthermore, this can offer better structural stability to ensure the mechanical integrity and long-term reliability of the electrode.

Through the high-precision pattern transfer printing, superior electrode quality, simplified process and optimized electrode design, the PV cell using the electrode grid lines 10 prepared with the preparation method can significantly improve the photoelectric conversion efficiency, lower the fabrication cost, improve the production efficiency, ensure the long-term stability and reliability of the cell, and contribute to application and development of the PV cell.

Embodiment 3

Figure 5:
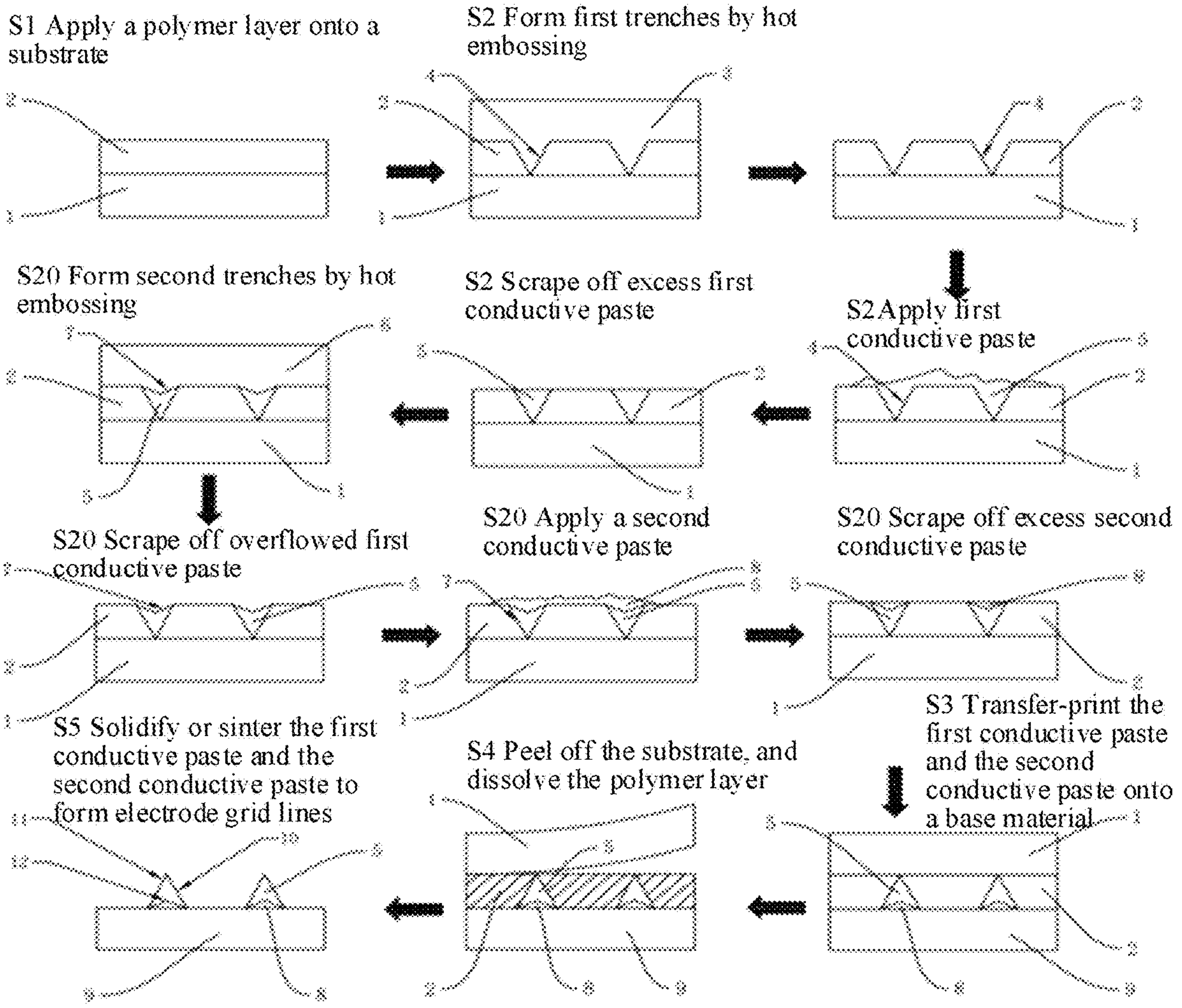
FIG. 5 is a schematic process flowchart of a preparation method of electrode grid lines according to Embodiment 3.
Figure 6:
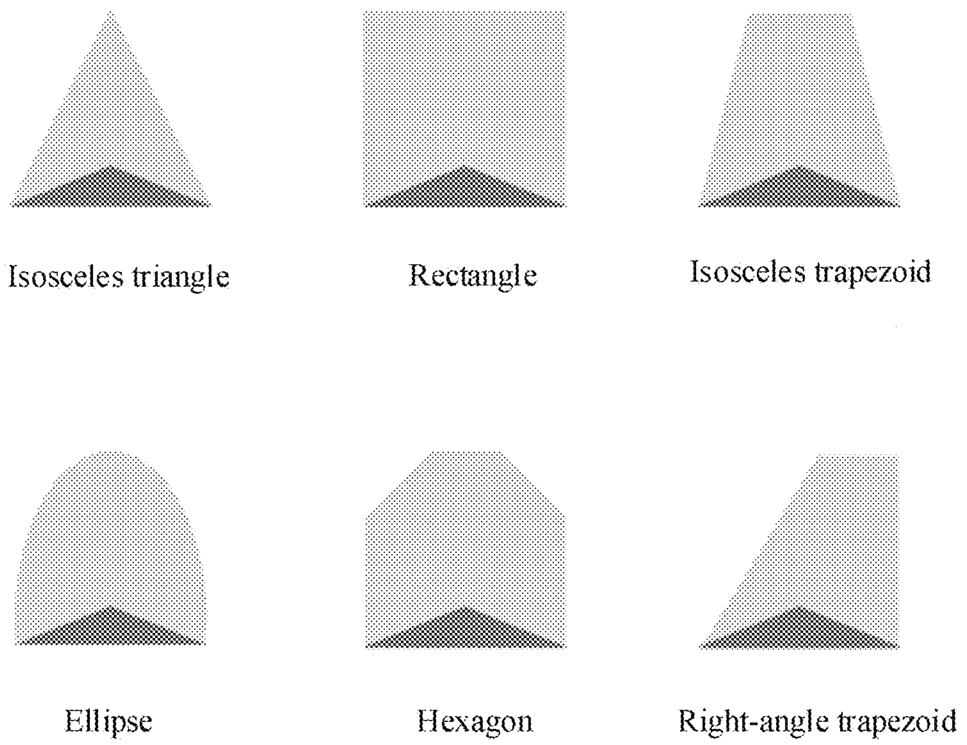
FIG. 6 is a diagram for showing a longitudinal section of the electrode grid line according to Embodiment 3.

Referring to FIG. 5 and FIG. 6, the embodiment differs from Embodiment 1 in: The preparation method of electrode grid lines further includes a step S20 between the step S2 and the step S3: Second mold 6 is provided, second trenches 7 are imprinted on the first conductive paste 5 with the second mold 6, and the first conductive paste 5 is dried. Second conductive paste 8 is applied onto the first conductive paste 5, such that the second conductive paste 8 fully fills the second trench 7. Excess second conductive paste 8 is scrapped off.

The preparation method of electrode grid lines 10 in the embodiments includes the following steps:

S1: Substrate 1 is provided, and polymer layer 2 is formed on the substrate 1. In this process, a surface of the substrate 1 should be clean and flat, so as to guarantee quality of the subsequent coating process. Surface treatment is performed on the substrate 1 to enhance adhesion for the polymer layer 2. The substrate 1 has a thickness of 100-200 μm. In the embodiment, preferably, the substrate 1 has the thickness of 150 km. A material of the substrate 1 includes, but is not limited to, one of PET, PI, PETG, PC, PP, and PU. In the embodiment, preferably, the material of the substrate 1 is the PI. The PI exhibits desirable thermal stability to withstand a high temperature up to 400 °C, and possesses high strength and toughness to provide excellent structural support and durability. Moreover, it demonstrates strong resistance to various chemicals, and can keep stable under various environments.

Before the coating, necessary pretreatment is performed on the substrate 1. The pretreatment method includes cleaning, drying and surface activation, so as to remove the pollutant on the surface of the substrate 1, increase the surface roughness, and improve the adhesion for the polymer layer 2. The specific pretreatment method includes, but is not limited to, the following steps: First of all, the surface is cleaned sequentially with deionized water, acetone and isopropanol to remove possible adhered impurities and grease. Then, the substrate 1 is placed into an ultrasonic cleaner, and cleaned for 15 min at an ultrasonic frequency of 40 kHz, so as to ensure that the surface has no any particulate residue. Upon the cleaning, the substrate 1 is placed into a hot air circulation device, and dried for 30 min at a temperature of 60 °C, so as to ensure complete drying.

The polymer layer 2 is prepared on the cleaned and treated substrate 1. In the embodiment, this step includes, but is not limited to, that the polymer layer 2 is formed on the substrate 1 by flatbed coating. Specifically, a homogeneous polymer solution is applied on the substrate 1, with a uniformity and a thickness controlled. To ensure a uniform and smooth coating, a doctor blade is set at a reasonable angle (which is 30-45° generally). Upon the coating, the substrate 1 is placed into a well-ventilated dry environment. Alternatively, the substrate is heated to accelerate volatilization of the solvent, including but not limited to that the substrate is dried through a hot-air oven for 20-30 min at 90-110 °C, such that the polymer is cross-linked to form the 10-12 μm polymer layer 2.

A thickness of the polymer layer 2 includes, but is not limited to, 5-30 μm. In the embodiment, preferably, the polymer layer 2 has the thickness of 15 μm. The polymer layer 2 with this thickness can achieve a tradeoff among the strength, flexibility and conductivity, making it suited for diverse application requirements. Furthermore, the thin-layer design of polymer layer 2 reduces the material waste and is applicable to high-density integrated electronic equipment or microstructures.

In the embodiment, a Tg of the polymer layer 2 is 70-100 °C. A material of the polymer layer 2 includes, but is not limited to, a water-soluble polymer material. The water-soluble polymer material includes, but is not limited to, one of PVA, PVP, PEG, MPVA, PAAS, PVA-PAA, and PVA-PAN. In the embodiment, preferably, the water-soluble polymer material is the PVA. The PVA can be heated to 150 °C, but is prone to discoloration and embrittlement when heated to 180 °C, offering a wide temperature processing range. The PVA is insoluble in organic solvents such as gasoline, kerosene, plant oil, benzene, toluene, dichloroethane, carbon tetrachloride, acetone, ethyl acetate, methanol, and ethylene glycol.

The PVA is soluble in water, such that coating and film-forming processes are more convenient, without complex solvent treatment. Moreover, the water-soluble PVA is cleaned easily after use, with excellent biocompatibility and friendliness to the body and environment, to reduce the environmental burden.

The PVA is a polymer containing numerous super-hydrophilic —OH groups, exhibiting excellent hydrophilicity. Its water solubility is largely determined by a degree of polymerization and especially an alcoholysis degree. Due to the abundance of hydroxyl groups, there are strong intra- and intermolecular hydrogen bonds within the PVA to hinder the dissolution of the PVA in water. Therefore, the higher alcoholysis degree means the poorer water solubility of the PVA. In addition, the residual acetate groups on molecular chains of partially alcoholized PVA are intrinsically hydrophobic, such that neighboring intra- and intermolecular hydrogen bonds may also be weakened. Thus, a moderate amount of acetate groups may enhance the water solubility of the PVA. As the acetate groups increase, the endothermic dissolution becomes more pronounced, and the critical temperature for phase separation decreases, leading to a gradual decline in solubility at high temperatures. Therefore, the factors influencing the water solubility of the PVA are complex.

In the embodiment, through adjustment on an alcoholysis degree of the PVA or blending modification, the water solubility of the PVA can be changed, such that the PVA is dissolved quickly at an ambient temperature. Specifically:

a. The alcoholysis degree of the PVA (the degree of alcoholysis of the PVA) is adjusted appropriately. Specifically, the PVA is generated via alcoholysis by adding an aqueous sodium hydroxide solution to a polyvinyl acetate methanol solution (containing 1-2% of water) (refer to reaction (1.1)). During the alcoholysis, due to water in the system and a large molar ratio of alkali, the reaction (1.1) is accelerated. Meanwhile, the water enhances dissociation of the alkali, thereby strengthening the catalytic effect and further accelerating the transesterification reaction (1.2). The overall reaction proceeds rapidly and can be completed within approximately 1 min. The wet alcoholysis (high-alkali alcoholysis) features a rapid reaction rate, compact equipment, high production capacity, and a continuous alcoholysis process.

(1.1)

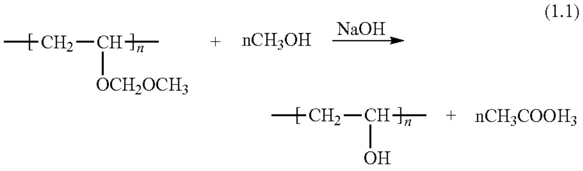

(1.2)

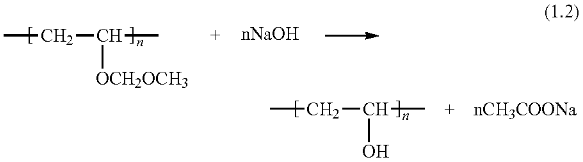

Specifically, after heated by a preheater, the polyvinyl acetate methanol solution is mixed uniformly and rapidly with a sodium oxide methanol solution as an alcoholysis catalyst in a static mixer for 0.1-0.3 min. The resulting mixture is fed into a twin-screw extrusion alcoholysis machine, and alcoholized for 0.5-4 min at 45-75 °C. The alcoholized product is washed with an acid-containing solvent and dried, yielding the white granular partially alcoholized PVA product.

In the embodiment, the alcoholysis degree may be adjusted according to an actual need. For instance, the PVA with an 80% alcoholysis degree is used for low-temperature water dissolution at 40 °C, while the PVA with an 88% alcoholysis degree is used for high-temperature water dissolution.

b. The water solubility of the PVA may be changed by blending the PVA with other water-soluble polymers or additives. Specifically, hydrophilic polymers or additives (such as PAA and polyglycolic acid) having desirable compatibility with the PVA are selected. Different blending ratios are designed according to application requirements. Common blending ratios may be 10-50%. Different blending ratios have a direct impact on the water solubility and physical properties. The PVA and the blending material at a selected ratio are molten at a high temperature, followed by cooling to form a blend. This can enhance the solubility and dissolution rate of the PVA. By optimizing the blending ratio and selecting an appropriate modifier, the dissolving property of the PVA can be adjusted to meet the specific application requirements.

The water dissolution rate of the alcoholized or blended PVA can be tested. Specifically, by immersing a sample into water, dissolution time of the sample is observed and data is recorded. The mechanical strength, ductility, tensile strength and the like of the PVA can also be tested to evaluate the impact of the blending modification on the material performance.

S2: First mold 3 is provided, and first trenches 4 corresponding to a desired electrode pattern are imprinted on the polymer layer 2 with the first mold 3 by hot embossing. In the embodiment, a material of the first mold 3 is one of monocrystalline silicon, polycrystalline silicon, copper, nickel, copper-nickel alloy, nickel-iron alloy, iron-aluminum alloy, and aluminum alloy. In the embodiment, the first trench 4 has a depth of 15±2 μm, and the first trench 4 has an aspect ratio of 2:1.

In the embodiment, the electrode pattern of the polymer layer 2 has an aperture width of 3-10 μm, and an aspect ratio of 2:1. That is, the first trench 4 has a notch width of 3-10 μm, and an aspect ratio of 2:1. When the polymer layer 2 has the thickness of 5-30 μm, and the electrode patterned aperture has the width of 3-10 μm, and the aspect ratio of 2:1, the filling efficiency of the subsequent conductive material and the dimensional accuracy of the electrode grid line 10 can be taken into account. With the smaller aperture width, the parasitic resistance between the electrode grid lines 10 is reduced, and the current collection efficiency of the cell is improved. Meanwhile, within the range of the width, the conductive material can be fully and uniformly filled in the aperture to prevent a void or a defect. By accurately controlling the thickness of the polymer layer 2 and the width of the patterned aperture, the dimensional accuracy of the electrode grid line 10 can be improved significantly, thereby reducing performance fluctuation and a defect rate caused by dimensional deviation.

In the embodiment, this step includes, but is not limited to, that the polymer layer 2 is hot-embossed through a hot-embossing machine to form the first trenches 4 corresponding to the electrode pattern. In the embodiment, a hot-embossing temperature on the polymer layer 2 is 80-180 °C. Preferably, an optimal hot-embossing condition includes a hot-embossing temperature of 120-180 °C, a hot-embossing pressure of 10 MPa, and a hot-embossing duration of 2 min. Under this condition, the first trench 4 can be hot-embossed desirably.

Specifically, the dried polymer layer 2 is placed on the hot-embossing machine. According to characteristics of the polymer layer 2 and accuracy of the desired electrode pattern, the hot-embossing machine is set at the temperature of 120-180 °C, the pressure of 10 MPa, and the duration of 2 min. The polymer layer 2 can be softened at this temperature. Under this pressure, the pattern of the first mold 3 on the hot-embossing machine can be imprinted completely at high accuracy. With this duration, details of the pattern can be replicated accurately. The dried polymer layer 2 is placed on a heating plate of the hot-embossing machine. Then, the first mold 3 is aligned and pressed down. The heating plate is heated to the temperature of 120-180 °C. The first mold 3 is pressed into the polymer layer 2 under a 10 MPa pressure of the heating plate, so as to imprint the first trenches 4 corresponding to the desired electrode pattern and having the depth of 10 μm and the width of m. The hot embossing lasts for 2 min to ensure that the polymer layer 2 is fully formed at the high temperature and the high pressure. Upon the hot embossing, the first mold 3 and the polymer layer 2 are cooled to the room temperature. In the cooling process, the polymer layer 2 is allowed to maintain its shape in the first mold 3, such that the shape and size of the first trench 4 are stabilized. Upon the cooling, the first mold 3 is carefully taken down from the polymer layer 2. The pattern of the first trench 4 is clear, and matches with the desired electrode pattern. Careful inspection is made to determine whether the shape and size of the first trench 4 meet requirements of the electrode pattern of the micrometer scale or even the nanometer scale.

In this process, the hot-embossing temperature is above a Tg of the PVA and below a melting point of the PVA, which prevents discoloration and embrittlement of the polymer layer 2 in the hot embossing to ensure the processability, stability, and uniformity of the material. Under the above optimal hot-embossing condition, the polymer layer 2 can be shaped better to form the accurate first trenches 4, thereby improving the processing accuracy and final product quality. By controlling the hot-embossing temperature within a safe range, a thermal stress caused by an overhigh temperature is reduced, thereby reducing thermal injury to the material.

The first trench 4 corresponds to the electrode grid line 10 in shape and size. In actual operation, the size and shape of the electrode grid line 10 to be transfer-printed are controlled to reduce an ohmic loss of the electrode grid line 10. A longitudinal section of the first trench 4 is in the shape including but not limited to a triangle, a trapezoid, a rectangle, a rhombus, a semicircle, and a polygon. In the embodiment, preferably, the longitudinal section of the first trench 4 is in the shape of the triangle or trapezoid or semi-ellipse. The longitudinal section facilitates change of incident and refractive paths of the light, can capture and guide the light better, and can effectively reduce the reflective loss of the light, such that more light is absorbed by the semiconductor material and converted into electric energy, thereby improving the photoelectric conversion efficiency.

First conductive paste 5 is applied onto the polymer layer 2 by flatbed coating, such that the first conductive paste 5 fully fills the first trench 4. The excess first conductive paste 5 is scraped off.

Specifically, on the polymer layer 2 formed with the first trenches 4, the first conductive paste 5 is applied uniformly by the flatbed coating. The appropriate first conductive paste 5 is selected. A flatbed coater or a blade coating tool is used for coating. The first conductive paste 5 is applied uniformly onto the polymer layer 2. Applying an appropriate pressure and moving at an appropriate speed along a surface of the polymer layer 2 can ensure that the first conductive paste 5 is extruded into the first trench 4, and the material can fully fill all voids in the first trench 4, and cover the whole surface of the first trench. Upon the coating, the excess first conductive paste 5 is scraped off with a doctor blade or other tools, ensuring that the first conductive paste 5 in the first trench 4 is leveled and tightly bonded to the polymer layer 2.

In the embodiment, the first conductive paste 5 includes, but is not limited to, one of aluminum paste, copper paste, chromium paste, tin paste, indium paste, nickel paste, titanium paste, and tantalum paste. Preferably, the first conductive paste 5 is the aluminum paste. The aluminum exhibits desirable conductive performance, and can meet the conductive requirements of numerous electronic devices and circuits. Compared with other metal pastes, the aluminum paste has a relatively low cost, making its manufacturing and use economically viable, particularly evident in large-scale applications. It can be widely applied in diverse fields such as conductive coatings, flexible electronic components, solar cells, and printed circuit boards (PCBs).

S20: Second mold 6 is provided, second trenches 7 are imprinted on the first conductive paste 5 with the second mold 6 by hot embossing, and the first conductive paste 5 is dried. In the embodiment, a material of the second mold 6 is one of monocrystalline silicon, polycrystalline silicon, copper, nickel, copper-nickel alloy, nickel-iron alloy, iron-aluminum alloy, and aluminum alloy.

In the embodiment, this step includes, but is not limited to, that the first conductive paste 5 is hot-embossed through the hot-embossing machine to form the second trenches 7. In the embodiment, a hot-embossing temperature on the first conductive paste 5 is 80-180 °C. Preferably, an optimal hot-embossing condition includes a hot-embossing temperature of 120-180 °C, a hot-embossing pressure of 10 MPa, and a hot-embossing duration of 2 min. Under this condition, the second trench 7 can be hot-embossed desirably. In the embodiment, the second trench 7 has a depth of 2-5 μm. A width of the second trench 7 is the same as a width of the first trench 4. A ratio of a height of the first trench 4 to a height of the second trench 7 is 2:1 to 5:1. Preferably, the ratio of the height of the first trench 4 to the height of the second trench 7 is 3:1. With the same width, two conductive layers are aligned desirably to improve conductive performance and stability of the electrode.

Specifically, the hot-embossing machine is set at the temperature of 120-180 °C, the pressure of 10 MPa, and the duration of 2 min. The first conductive paste 5 can be softened at this temperature. Under this pressure, the pattern of the second mold 6 on the hot-embossing machine can be imprinted completely at high accuracy. With this duration, details of the pattern can be replicated accurately. The dried polymer layer 2 and the first conductive paste 5 are placed on a heating plate of the hot-embossing machine. Then, the second mold 6 is aligned and pressed down. The heating plate is heated to the temperature of 120-180 °C. The second mold 6 is pressed into the first conductive paste 5 under a 10 MPa pressure of the heating plate, so as to imprint the second trench 7 having the depth of 2-5 μm and the width of 5 μm. The hot embossing lasts for 2 min. The first conductive paste 5 overflowed onto the surface of the polymer layer 2 is scraped off. Upon the hot embossing, the first conductive paste 5 is dried at 80-200 °C. Preferably, the first conductive paste 5 is dried at 120-180 °C. In this process, the first conductive paste 5 is allowed to maintain its shape in the second mold 6, such that the shape and size of the second trench 7 are stabilized. Upon drying, the second mold 6 is taken down. The pattern of the second trench 7 is clear. Careful inspection is made to determine whether the shape and size of the second trench 7 meet requirements of the electrode pattern of the micrometer scale or even the nanometer scale.

Under the above optimal hot-embossing condition, the first conductive paste 5 can be shaped better to form the accurate second trenches 7, thereby improving the processing accuracy and final product quality. By controlling the hot-embossing temperature within a safe range, a thermal stress caused by an overhigh temperature is reduced, thereby reducing thermal injury to the material.

Second conductive paste 8 is applied onto the first conductive paste 5 by flatbed coating, such that the second conductive paste 8 fully fills the second trench 7. Excess second conductive paste 8 is scraped off.

Specifically, on the polymer layer 5 formed with the second trenches 7, the second conductive paste 8 is applied uniformly by the flatbed coating. The appropriate second conductive paste 8 is selected. A flatbed coater or a blade coating tool is used for coating. The second conductive paste 8 is applied uniformly onto the first conductive paste 5, ensuring that the material can fully fill all voids in the second trench 7, and cover the whole surface of the second trench. Upon the coating, the excess first conductive paste 8 is scraped off with a doctor blade or other tools, ensuring that the second conductive paste 8 in the second trench 7 is leveled and tightly bonded to the first conductive paste 5.

In the embodiment, a contact resistance of the second conductive paste 8 is less than a contact resistance of the first conductive paste 5. An electrical conductivity of the second conductive paste 8 is greater than an electrical conductivity of the first conductive paste 5. The second conductive paste 8 serves as a material that comes in direct contact with the base material 9 subsequently. With the low contact resistance and high electrical conductivity of the second conductive paste 8, connection performance between the base material 9 and the electrode can be improved, ensuring that a current can smoothly flow through each contact point. With the desirable conductive performance, the overall reliability of the equipment is improved, and the performance reduction or fault caused by poor contact is prevented.

In the embodiment, preferably, the second conductive paste 8 includes, but is not limited to, silver paste. By confining the silver paste in an area contacting the base material 9, the usage of the silver paste can be reduced significantly, without affecting the conductive performance of the whole circuit. By contrast, the first conductive paste 5 can utilize a material with superior conductive performance to compensate for partial performance deficiencies. By combining the silver paste as the second conductive paste 8 with the cost-effective aluminum paste as the first conductive paste 5, the present disclosure not only can lower the production cost, but also can improve the product performance, ensure the conductive performance, improve the mechanical strength, and the like.

The silver paste includes a binder. The binder in the silver paste is nonreactive. The binder is phenolic resin or epoxy resin. The binder is used to enhance bonding between particles of the silver paste. In the embodiment, the binder has a shear strength of 10-30 MPa, with excellent bonding performance and chemical resistance. The binder can effectively enhance a bonding force between the silver particles in the silver paste, thereby reducing disruption of a conductive path in the silver paste and improving the electrical conductivity.

The polymer layer 2 of the PVA is incompatible and nonreactive with the binder of the silver paste. With the nonreactive property, the PVA and the silver paste are not chemically changed or degraded to keep respective properties stable. This can ensure that the materials play the optimal effect in expected applications, without mutual influence. Moreover, the processed polymer layer 2 can be removed easily through the water solubility, without compromising performance of the silver paste.

S3: The base material 9 is provided, the base material 9 is covered with the polymer layer 2, the polymer layer 2, the first conductive paste 5 and the second conductive paste 8 are transfer-printed onto the base material 9 at a certain temperature and a certain pressure, and the second conductive paste 8 is dried and shaped to enhance adhesion to the surface of the base material 9. This step includes, but is not limited to, that the polymer layer 2, the first conductive paste 5 and the second conductive paste 8 are adhered to the base material 9 through a high temperature of 80-180 °C and a pressure of 1-20 MPa. In the embodiment, preferably, an optimal hot-embossing transfer condition includes a hot-embossing temperature of 120-180 °C, a hot-embossing pressure of 10 MPa, and a hot-embossing duration of 8 min. Under this condition, the polymer layer 2, the first conductive paste 5 and the second conductive paste 8 can be adhered to the base material 9 desirably. In this process, the second conductive paste 8 is dried and shaped to enhance the adhesion to the surface of the base material 9. The first conductive paste 5 and the second conductive paste 8 are morphologically intact without deformation, and the polymer layer 2 and the substrate 1 can be separated desirably.

Specifically, a surface of the base material 9 is cleaned to remove any pollutant or particle, ensuring that the surface of the base material 9 is clean and flat. The base material 9 is covered with the polymer layer 2 coated with the first conductive paste 5 and the second conductive paste 8, which is aligned accurately at the base material 9, ensuring that the first conductive paste 5 and the second conductive paste 8 are aligned at positions on the base material 9. To improve alignment accuracy, an alignment tool or a visual alignment system may be used. The polymer layer is slightly placed on the base material 9, ensuring that each portion of the second conductive paste 8 comes in intimate contact with the surface of the base material 9. At the pressure of 10 MPa and the hot-embossing temperature of 120-180 °C, the polymer layer 2, the first conductive paste 5 and the second conductive paste 8 are pressed onto the base material 9. The pressure should be distributed uniformly to ensure that the first conductive paste 5 and the second conductive paste 8 are bonded completely to form the clear pattern. In this step, the pressure should be applied uniformly to ensure accurate transfer printing of the first conductive paste 5 and the second conductive paste 8. After the pressure is applied, the first conductive paste, the second conductive paste and the base material 9 are hot-embossed for 8 min, to ensure that the first conductive paste 5 and the second conductive paste 8 come in full contact and adhesion to the base material 9.

In the embodiment, the binder can further enhance bonding between the particle of the silver paste as the second conductive paste 8 and the base material 9. Upon hot-embossing transfer, the first conductive paste 5, the second conductive paste 8 and the polymer layer 2 are tightly adhered to the base material 9, and the substrate 1 can be easily peeled off from the other side. The binder in the silver paste can promote the adhesion between the particle in the silver paste and the base material 9, improve a bonding strength between the second conductive paste 8 and the base material 9, and further optimize the conductive performance, while improving the overall durability and reliability.

S4: The substrate 1 is peeled off from the polymer layer 2, and the polymer layer 2 is dissolved, leaving the first conductive paste 5 and the second conductive paste 8 adhered to the base material 9. The base material 9 includes, but is not limited to, one of monocrystalline silicon base material 9, polycrystalline silicon base material 9, perovskite base material 9, glass base material 9, and plastic base material 9. In the embodiment, preferably, the base material 9 is the polycrystalline silicon base material 9. The polycrystalline silicon base material 9 exhibits excellent electrical conductivity and stability, along with superior thermal stability and thermal conductivity, making it suitable for fabrication of various electronic devices and applicable to the PV cell in the present disclosure.

Specifically, upon the transfer printing, the substrate 1 is peeled off from the polymer layer 2 first, and then the polymer layer 2 is dissolved with ambient-temperature water. In the embodiment, a temperature of the ambient-temperature water includes, but is not limited to, 20-25 °C. After the substrate 1 is peeled off, the polymer layer 2 is immersed into a container filled with the ambient-temperature water. The temperature of the water should be maintained at a room temperature of 20-25 °C, so as not to cause thermal injury to the first conductive paste 5, the second conductive paste 8 or the base material 9. During immersion, the polymer layer 2 is gradually dissolved in the water.

In order to dissolve the polymer layer 2 completely, the water may be stirred moderately or the temperature of the water is increased to promote the uniform dissolution process. A duration in this process depends on the thickness and material properties of the polymer layer 2. During this process, the dissolving condition of the polymer layer 2 should be inspected regularly to ensure complete dissolution of the polymer layer. When the polymer layer 2 is dissolved completely, the pattern of the first conductive paste 5 and the second conductive paste 8 on the surface of the polymer layer 2 is retained on the base material 9 completely.

In order to further ensure the adhesion and stability of the first conductive paste 5 and the second conductive paste 8, the surface of the base material 9 may be rinsed with clean water to remove possible particulate residues from the polymer layer 2. At last, the transfer-printed base material 9 is air-dried or dried using other methods for next treatment.

S5: The first conductive paste 5 and the second conductive paste 8 are solidified or sintered to form the electrode grid lines 10. In the embodiment, this step includes, but is not limited to, that the first conductive paste 5 and the second conductive paste 8 are solidified or sintered at a temperature of 200-1000 °C.

Specifically, the base material 9 coated with the first conductive paste 5 and the second conductive paste 8 is placed into a heating furnace and solidified or sintered at a temperature of 200-1000 °C. The temperature and duration in the solidifying or sintering process should be set according to the first conductive paste 5 and the second conductive paste 8, such that the first conductive paste and the second conductive paste can be solidified or sintered completely at the temperature, without damage on the base material 9. The solidifying or sintering duration should be set according to properties of the first conductive paste 5 and the second conductive paste 8, ensuring that the material has enough time at the temperature to realize chemical reaction or physical transformation to achieve optimal conductive performance and adhesion. Upon solidifying or sintering, the base material 9 is naturally cooled to the room temperature, so as not to damage the electrode grid lines 10 for thermal stress. The solidified or sintered electrode grid lines 10 are inspected to ensure that the pattern of the electrode grid line is clear with desirable adhesion. Phenomena such as poor conductivity, defect or separation are inspected to ensure that quality of the electrode grid line 10 meets the design requirements.

In this process, if necessary, any residue or pollutant in the solidifying or sintering process is removed. Electrical performance testing may also be conducted to verify whether the conductive performance of the electrode grid line 10 complies with specifications and validate the performance of the electrode grid line in actual applications.

With a dual-layer conductive paste structure, the method in the present disclosure improves the conductive performance, stability and performance of the electrode, ensuring that the electrode exhibits more excellent electrical characteristics in actual applications, and the production cost can be effectively lowered. The trenches are imprinted on the polymer layer 2 with the mold. The pressure and temperature in the transfer printing ensures that the first conductive paste 5 and the second conductive paste 8 can be accurately transferred and adhered onto the base material 9. The method keeps accuracy of the electrode pattern, realizes high-resolution and high-precision electrode pattern fabrication, ensures the accuracy and repeatability of the electrode structure, and meets stringent requirements of photoelectric devices on the shape and size of the electrode.

With multiple steps integrated together, and through technologies such as flatbed coating, transfer printing, water dissolution, drying and high-temperature sintering, the process realizes accurate application and solidification of the first conductive paste 5 and the second conductive paste 8 on the polymer layer 2 carrier, ensures the accuracy and stability of the electrode pattern, omits the complex procedures in the conventional fabrication method, improves the production efficiency, and lowers the fabrication cost. In combination of the heat and the pressure, the method ensures desirable contact and bonding between different materials, enhancing the adhesion of the conductive paste to the base material 9, ensuring that the electrode is not separated easily in long-term use, improving the overall performance of the electrode, and prolonging the service life of the device. The polymer layer 2 can be dissolved subsequently for removal, which reduces the waste material generated in the conventional technology to minimize the environmental pollution. Compared with the conventional screen printing, the present disclosure can improve the production efficiency to some extent, and meet requirements of large-scale production, thereby improving the market competitiveness.

The embodiment of the present disclosure further provides a PV cell, including the electrode grid lines 10 prepared with the above preparation method.

The electrode grid line 10 includes first conductive layer 11 formed by the first conductive paste 5 and second conductive layer 12 formed by the second conductive paste 8. The first conductive layer 11 and the second conductive layer 12 have a same bottom. A ratio of a height of the first conductive layer 11 to a height of the second conductive layer 12 is 2:1 to 5:1. With the same bottom, the interlayer bonding force is enhanced, the poor current conduction caused by an interface problem between the materials is reduced, and the mechanical strength and long-term stability of the cell are improved.

The second conductive layer 12 is a conductive layer that comes in direct contact with the base material 9. The material of the second conductive layer 12 is the silver paste.

The material of the first conductive layer 11 is the aluminum paste. The aluminum paste as the first conductive layer 11 provides a cost-effective conductive solution, while the silver paste as the second conductive layer 12 facilitates higher conductive performance. Since the silver has the better conductive performance than the aluminum, adjusting the height ratio (2:1 to 5:1) of the two layers can optimize the current conduction path, and improve the current transmission efficiency, thereby promoting the overall conductive performance of the electrode.

Compared with the single use of the high-cost conductive material (such as the silver paste), the layered design can reduce the usage of the silver paste, without compromising performance of the electrode, which can reduce the usage of the silver paste and in turn effectively reduces the production cost. The electrode grid line 10 with such a design not only improves performance of the PV cell, but also ensures the cost effectiveness and long-term stability.

In the embodiment, the height of the electrode grid line 10 includes, but is not limited to, 10±2 μm. The electrode grid line 10 has the aspect ratio of 2:1. A shape of an outer edge of the electrode grid line 10 includes, but is not limited to, one of a triangle, a trapezoid, a rectangle, a rhombus, a semicircle, and a polygon. The outer edge of the electrode grid line 10 is in the shape of a plurality of geometric configurations. These configurations can effectively achieve a tradeoff between light trapping and current extraction. Different configurations may affect an effective contact area of the whole electrodes, thus affecting the conductive performance.

An outer edge of the first conductive layer 11 is in the shape of an isosceles triangle, an isosceles trapezoid or a symmetric semi-ellipse. The isosceles triangle has a vertex angle of 20-60°. The isosceles trapezoid has a base angle of 30-70°. The first conductive layer 11 has an aspect ratio of 2:1. An outer edge of the second conductive layer 12 is in the shape of an isosceles trapezoid. The isosceles trapezoid has a vertex angle of 120-160°. The second conductive layer 12 has an aspect ratio of 1:2.

With the symmetric geometric design for the first conductive layer 11 and the second conductive layer 12, the current conduction path can be optimized, and the current is less hindered in the conductive layer, thus improving the conductive performance. While the ratio of the height of the first conductive layer 11 to the height of the second conductive layer 12 is 2:1 to 5:1, the first conductive layer 11 has the aspect ratio of 2:1. This can provide desirable loading capacity and current-carrying capacity, and is suitable for high-efficiency current conduction. The second conductive layer 12 has the aspect ratio of 1:2, which can effectively increase the contact area of the electrode, and ensure uniform stress distribution of the conductive layer, further improving the conductive performance. With the above angular design for the first conductive layer 11 and the second conductive layer 12, the current return loss is minimized to enhance effective current conduction.

The PV cell using the electrode grid lines 10 obtained with the preparation method exhibits remarkable advantages in conductive performance, production efficiency, environmental sustainability, and structural stability, effectively lowering the fabrication cost of the PV cell, improving the production efficiency, and demonstrating a promising potential for broad application in PV cell industry. The combined structure using the first conductive paste 5 and the second conductive paste 8 ensures superior conductive performance of the electrode grid line 10. The second conductive paste 8 provides the low contact resistance at the contact surface of the cell to improve the current collection efficiency. The accurate design of the electrode pattern and the aperture width affectively reduces a parasitic resistance between the electrode grid lines 10, further improving the energy conversion efficiency of the PV cell. The technical solution in which the electrode grid lines 10 are prepared with the aluminum paste and the silver paste is significantly inventive and piratical, and is expected to propel the development for the printing technology of the electrode grid line 10 of the PV cell and to create new development opportunities for the PV industry.

Moreover, by integrating multiple steps through mold imprinting and transfer printing, the method can fabricate the high-resolution electrode pattern. With superior electrode adhesion and environmental resistance, the cell is more stable in long-term use, prolonging the service life, ensuring the accuracy and repeatability of the electrode structure, and meeting stringent requirements of the photoelectric device on the shape and size of the electrode. By controlling the structure of the electrode grid line 10, the method can improve the light absorption efficiency to effectively convert more photons into electric energy.

Embodiment 4

Figure 7:
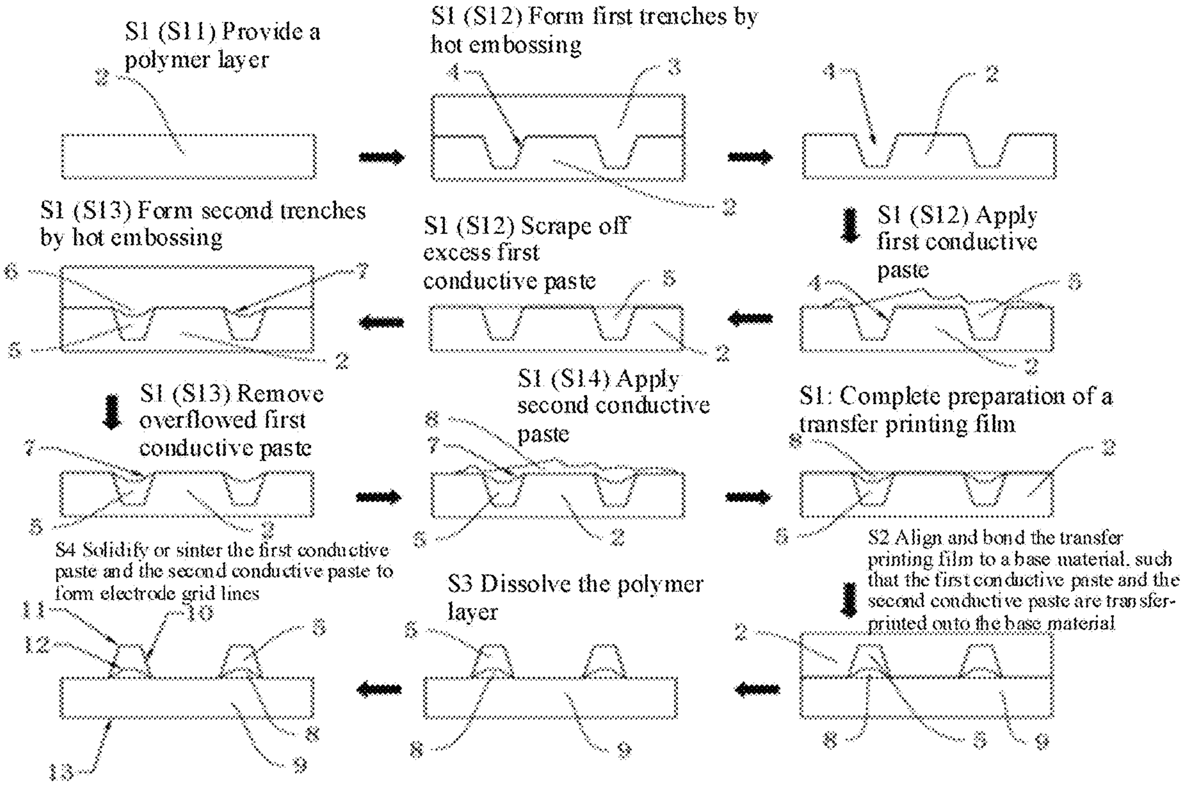
FIG. 7 is a schematic process flowchart of a preparation method of electrode grid lines according to Embodiment 4.
Figure 8:
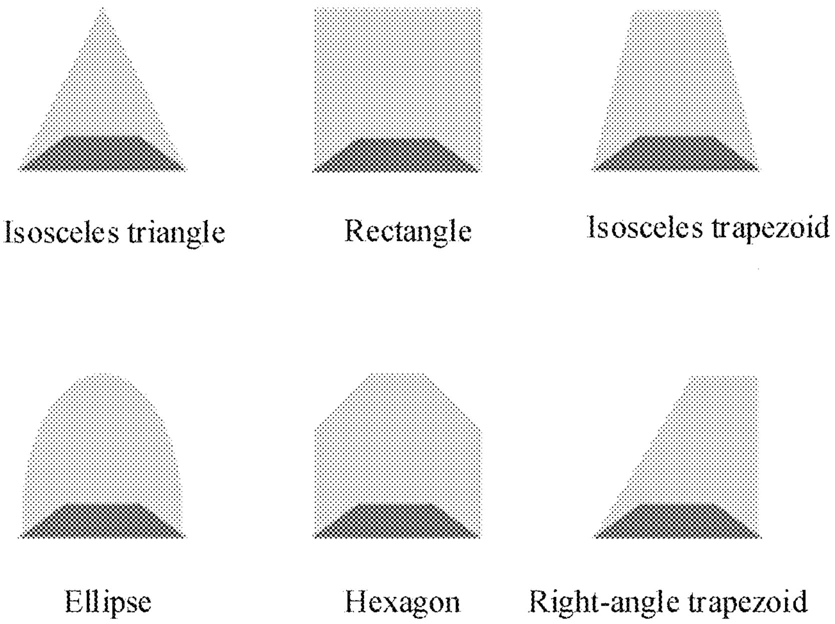
FIG. 8 is a diagram for showing a longitudinal section of the electrode grid line according to Embodiment 4.

Referring to FIG. 7 and FIG. 8, the embodiment differs from Embodiment 1 in: The preparation method of electrode grid lines includes the following steps:

S1: A transfer printing film having a composite conductive paste is provided.

In the embodiment, a preparation method of the transfer printing film having the composite conductive paste includes the following steps:

S11: Polymer layer 2 is provided, and first trenches 4 corresponding to a desired electrode pattern are imprinted on the polymer layer 2 with first mold 3. The desired electrode pattern can be obtained by imprinting, which can improve the accuracy and facilitate implementation. The imprinting may be hot-embossing imprinting. In the embodiment, the polymer layer 2 includes, but is not limited to, a PVA thin film.

Preferably, the step S11 specifically includes: The prepared PVA thin film is placed into the first mold 3 through a precise hot-embossing machine, and hot embossing is performed at a temperature of 80-180 °C, such that the first trench 4 of a micrometer scale or even a nanometer scale corresponding to the electrode pattern is formed on the surface of the PVA thin film.

Specifically, the above step includes, but is not limited to:

1. Mold preparation: The preset mold is cleaned to ensure that its surface is free of stains and particulate pollutants, thereby guaranteeing the imprinting quality.
2. Polymer layer 2 preparation: The polymer layer 2 is prepared, with a flat and clean surface. For example, the polymer layer 2 is the PVA thin film.
3. Heating and imprinting: The first mold 3 is aligned at the polymer layer 2, followed by imprinting at a preset temperature. The pressure and duration are controlled by the above parameter, ensuring that the pattern of the first mold 3 is completely pressed into the polymer layer 2.

Certainly, the parameter may be set according to an actual use requirement, and is not limited in the present disclosure.

4. Cooling and demolding: Upon the imprinting, the first mold 3 and the polymer layer 2 are cooled to ensure material solidification. Then, the mold is removed carefully to obtain the polymer layer 2 having the electrode pattern trench.

With the hot-embossing machine, the accuracy of the PVA transfer-printed coating after the hot embossing can be ensured. Reasonable design on the size and shape of the grid line can reduce the ohmic loss.

According to the embodiment of the present disclosure, preferably, the first mold 3 includes one of monocrystalline silicon base material 9, polycrystalline silicon base material 9, copper base material 9, nickel base material 9, copper-nickel alloy base material 9, nickel-iron alloy base material 9, iron-aluminum alloy base material 9, or aluminum alloy base material 9.

The availability of multiple materials ensures flexibility and ease of implementation.

It should be noted that the monocrystalline silicon base material is commonly used in the fabrication of high-efficiency PV cells for excellent conductive performance and thermal stability. The polycrystalline silicon base material is widely used in the PV field for the relatively low cost, high mechanical strength and stability. The copper base material is suitable for applications requiring rapid electrical conduction, with good conductive performance and thermal conductivity. The nickel base material offers superior corrosion resistance and mechanical strength, ideal for long-term electrode fabrication. The copper-nickel alloy base material combines the conductive performance of copper with the corrosion resistance of nickel, suitable for high-demand electrical equipment. The nickel-iron alloy base material is magnetic and corrosion-resistant, often used in electromagnetic device fabrication. The iron-aluminum alloy base material is lightweight, heat-resistant, and corrosion-resistant, suitable for aerospace and high-temperature electrode applications. The aluminum alloy base material is lightweight with good thermal conductivity, widely used in PV cell frames and electrical conductors.

According to the embodiment of the present disclosure, preferably, a protrusion of the first mold 3 is complementary in terms of shape to the first trench 4.

The first mold 3 is in the shape of one of an isosceles triangle, an isosceles trapezoid, an ellipse, a hexagon, a right trapezoid, or a rectangle. It is to be understood that the protrusion corresponds to the electrode grid line 10 in shape and size. In actual operation, the size and shape of the electrode grid line 10 to be transfer-printed are controlled to reduce an ohmic loss of the electrode grid line 10. A shape of a longitudinal section of the protrusion includes, but is not limited to, one of a triangle, a trapezoid, a rectangle, a rhombus, a semicircle, and a polygon. In the embodiment, preferably, the longitudinal section of the protrusion is in the shape of the triangle or the trapezoid. The triangular or trapezoidal longitudinal section facilitates change of incident and refractive paths of the light, can capture and guide the light better, and can effectively reduce the reflective loss of the light, such that more light is absorbed by the semiconductor material and converted into electric energy, thereby improving the photoelectric conversion efficiency.

The complementary shape for the protrusion of the first mold 3 and the first trench 4 can ensure precise alignment and imprinting effects during mold forming process, achieving high-precision transfer printing and enhancing the quality of the final electrode grid line 10.

Specifically, the shape of the first mold 3 may be selected from the following geometric configurations: Isosceles triangle: Suitable for scenarios requiring concentrated force transmission, producing sharp and clear transfer printing effect at the edge of the PV electrode grid line 10. Isosceles trapezoid: Wider bases and narrower tops enable gradual width transitions of the electrode grid line 10, ensuring uniform filling during the transfer printing process. Ellipse: Smooth edge transitions suit electrodes requiring more uniform current distribution, minimizing resistance and localized stress. Hexagon: Stable structures with uniform density distribution enhance transfer printing precision and stability of the electrode grid line 10. Right trapezoid: Ideal for PV electrode grid lines with uniform widths and clean edges, ensuring precise current distribution. Rectangle: Classic and designs for transfer printing of standardized electrode grid lines 10, maximizing the contact area to improve the current conduction efficiency.

According to the embodiment of the present disclosure, preferably, the shape of the first mold 3 has an aspect ratio of 1 to 3.

The aspect ratio of 1 to 3 offered by the shape of the mold can effectively adjusts the relationship between the protrusion height and width of the mold to optimize the transfer printing effect of the electrode grid line 10.

Specifically, when the aspect ratio is 1, the height and width of the mold are equal, suitable for electrode structures requiring flat grid lines with uniform thickness and width. This ensures desirable conductive performance of the electrode and uniform distribution of the silver paste during transfer printing.

In the embodiment, preferably, when the aspect ratio is close to 2, both the thickness and the width are moderate, enhancing the mechanical strength of the electrode while ensuring certain height of the grid line, thereby maintaining a fine structure. The design balances resistance, strength, and process difficulty, making it suitable for conventional PV electrode fabrication.

When the aspect ratio is 3, the height of the grid line significantly exceeds the width of the grid line, which is suitable for finer and narrower electrode designs. This effectively reduces resistance and increases current density. However, it demands higher mold precision during fabrication to ensure complete filling of the silver paste in the narrow trench.

Thus, the flexible setting of the aspect ratio range allows adjustment on the geometric shape of the electrode grid line 10 based on different PV cell design requirements, achieving an optimal tradeoff among conductive performance, mechanical strength, and production process.

S12: First conductive paste 5 is applied onto an imprinting formed side of the polymer layer 2 to at least completely fill the first trench 4, and excess first conductive paste 5 on a surface of the polymer layer 2 is removed, such that a surface of the first trench 4 is coplanar with a surface of the first conductive paste 5.

The first conductive paste 5 can be coated well to realize uniform filling and distribution in the first trench 4 of the polymer layer 2, thereby providing the basis and guarantee for the subsequent imprinting.

In the embodiment of the present disclosure, preferably, the step S12 specifically includes: The first conductive paste 5 is uniformly applied onto the hot-embossed polymer layer 2 with a flatbed coating method, such that the first conductive paste 5 completely fills the first trench 4, and excess first conductive paste 5 is scraped off to ensure that the first conductive paste 5 is filled fully and distributed uniformly, without deformation. The polymer layer 2 is a PVA thin film.

Specifically, the above step includes, but is not limited to:

I. Preparation of a coating environment 1.1 The hot-embossed polymer layer 2 is fixed on a workbench of a flatbed coater stably, so as to prevent movement or deformation in the coating process.

1.2 The first conductive paste 5 is prepared, and stirred uniformly, with no particle deposition and a moderate viscosity. The ideal viscosity of the conductive paste ranges from 1000 cP to 5000 cP, and specifically depends on coating requirements.

II. Coating process 2.1 Uniform coating: The first conductive paste 5 is uniformly applied onto the surface of the polymer layer 2 through a flatbed coater, with a thickness controlled appropriately, to ensure that the trench can be completely filled.

2.2 Pressure control: The pressure should be moderate in the coating, to ensure that the paste can get into the first trench 4 uniformly without deformation to the base material 9. The pressure can be controlled in a range of 0.1-0.5 MPa, and specifically adjusted according to flexibility of the base material 9 and the shape of the trench.

III. Excessive paste Ssraping 3.1 Operation of the doctor blade: The excess first conductive paste 5 is slightly scraped off from the surface of the base material 9 with the doctor blade, ensuring that the first conductive paste 5 only fills the first trench 4, with a flat surface, and no deformation or piling. A moderate pressure should be applied to the doctor blade, so as not to scrape off the paste in the trench. It is recommended to control an angle of the doctor blade at 45-60°, and operate the doctor blade at a stable speed to prevent damage to the surface of the base material 9.

3.2 Material of the doctor blade: According to suggestions, the doctor blade is made of a material with a moderate hardness, such as polytetrafluoroethylene (PTFE), polyurethane (PU) or flexible metal, so as not to scratch the base material 9 in the operation.

IV. Paste filling inspection 4.1 Visual inspection: Whether the trench is completely filled with the conductive paste is inspected through an optical microscope or other visual inspection means, ensuring no bubble and no void in the trench, as well as uniform distribution of the paste on the surface.

4.2 Thickness control: Whether the thickness of the coated paste meets a predetermined standard is detected. The thickness of the paste in the trench can be measured with a thickness gauge or a surface profiler to ensure uniformity of the conductive layer.

It should be noted that the binder (such as phenolic resin and epoxy resin) is one of main components in the PV silver paste, and functions to form stable bonding between particles of the silver paste as well as between the particle and the wafer.

S13: Imprinting is performed on the first conductive paste 5 in the first trench 4 with second mold 6 to form second trench 7 of a preset shape, and the overflowed first conductive paste 5 is removed.

According to the embodiment of the present disclosure, preferably, the step S13 specifically includes: The second trench 7 having a height of 2-5 μm, and a width of 5 μm is imprinted with the second mold 6 according to a preset requirement, the overflowed first conductive paste 5 is removed, and the first conductive paste 5 is dried at 80-200 °C.

Specifically, the above step includes, but is not limited to:

Trench imprinting with the second mold 6: The trench imprinted by the second mold 6 has the height of 2-5 μm, and the width of 5 μm. The mold is provided with a high-precision micro-nano structure at the bottom, and is made of hard alloy or hardened steel, to ensure the durability and accuracy. An anti-stick coating, such as a fluoride coating, should be provided on the surface of the mold, so as to prevent adhesion of the conductive paste to the surface of the mold.

Pressure application: The imprinting pressure should be stable, to ensure that the paste is completely pressed into the imprinted trench. Generally, it is recommended to control the pressure at 0.1-0.5 MPa. Excess pressure induces significant overflow of the paste, while the insufficient pressure fails to fully compact the paste.

Imprinting duration: The duration depends on the fluidity of the first conductive paste 5 and the imprinting pressure. The imprinting time is 30 s to 2 min. The insufficient duration results in incomplete imprinting, while excess duration induces deformation of the base material 9.

The temperature of the second mold 6 may be controlled in a range of 100-200 °C. Appropriately heating the second mold 6 can improve the fluidity of the first conductive paste 5, facilitating filling of the first conductive paste into the imprinted trench of the second mold 6.

Gap reservation: During the imprinting, the second trenches 7 are formed by designing the second mold 6 or controlling the pressure. To facilitate the subsequent operation, the second trench 7 may have a height of 0.5-1 μm.

The first conductive paste 5 is dried.

Drying temperature: The drying temperature should be 80-200 °C, and specifically depends on the component of the conductive paste, particularly volatility of a solvent in the silver paste or the copper paste.

It should be noted that the silver paste is generally dried at 80-200 °C, and solidified or sintered at 200-1000 °C.

Drying duration: Within the temperature range, the drying duration is controlled at 0.5-20 min, and specifically adjusted according to the thickness of the paste and performance of the drying device. The drying duration can be shortened at a higher temperature, while the drying duration is prolonged at a lower temperature.

Drying environment: A hot air circulating oven is used to ensure that the base material 9 and the conductive paste are dried at a uniform temperature. Certainly, according to an actual use demand, for fear of oxidation or pollution, the drying can be performed in an inert gas (such as nitrogen) environment.

S14: The second trench 7 is coated with second conductive paste 8, the first conductive paste 5 is covered with the second conductive paste 8, and excess second conductive paste 8 on the surface of the polymer layer 2 is removed.

In the embodiment, preferably, the step S14 specifically includes:

The applied second conductive paste 8 is brought into intimate contact with the formed first conductive paste 5, to form a robust composite layer.

By heating or applying a pressure, the conductive paste is fused mutually, ensuring that a composite layer is void-free, and a continuous conductive path is formed. A heating temperature is 80-200 °C, and a duration is 5-10 min.

In the embodiment, preferably, the step S14 further includes:

After excess paste is removed, the conductive paste is dried preliminarily at 80-200 °C for 10-20 min, ensuring that a solvent in the paste is volatilized, and the first conductive paste 7 and the second conductive paste 8 may be bonded completely.

Specifically, the second conductive paste 8 is coated. The second conductive paste 8 may be the silver paste or other conductive materials, provided that excellent conductive performance and desirable adhesion are achieved. The paste should have a moderate viscosity to ensure that the paste can be uniformly distributed and fill the trench in the application.

Flatbed coating: The second conductive paste 8 is uniformly dispensed onto the polymer layer 2, followed by applying a pressure via a doctor blade or a roller to control the coating thickness at the trench depth, thereby ensuring that the paste fully fills a preset shape.

Pressure composition: Upon the coating, a certain pressure may be applied such that the second conductive paste 8 and the first conductive paste 5 are tightly bonded. The pressure may be controlled in a range of 0.1-0.3 MPa to prevent overcompaction.

Drying: The first conductive paste 7 and the second conductive paste 8 are dried. Generally, a drying temperature is controlled at 80-200 °C, and a duration is 10-20 min, ensuring that the solvent in the paste is volatilized, and the first conductive paste 7 and the second conductive paste 8 may be bonded completely.

Bonding force enhancement: In order to improve a bonding force between two conductive paste layers, a small amount of the adhesive or interface treating agent may be added to the paste appropriately.

Upon the coating and composition, excess second conductive paste 8 on the surface of the polymer layer 2 is removed using a precise doctor blade or a coating removal device. During scraping, the doctor blade is parallel to the surface, so as not to damage the formed trench structure.

The doctor blade should be made of a material with a moderate hardness and wear resistance, such as stainless steel or hard rubber, so as not to damage the conductive paste. The pressure on the doctor blade should be applied uniformly, and generally controlled at 0.05-0.1 MPa, ensuring that only the paste is retained in the trench, with a smooth and flat surface.

Further, in the embodiment, the first conductive paste 5 is one of copper paste, chromium paste, tin paste, indium paste, nickel paste, titanium paste, and tantalum paste. The second conductive paste 8 is silver paste.

The silver paste includes a binder. The binder is phenolic resin or epoxy resin.

Further, the polymer layer 2 includes a water-soluble polymer material. The water-soluble polymer material is one of PVA, MPVA, PAAS, PVA-PAA, PVA-PAN, PVP, or PEG.

It should be noted that the polymer layer 2 in the present disclosure includes the PVA (PVA thin film).

Further, a longitudinal section of the electrode pattern is in the shape of one of a triangle, a trapezoid, a rectangle, a rhombus, a semicircle, or a polygon.

According to the embodiment of the present disclosure, preferably, before the step S11 that the polymer layer 2 having the preset thickness and formed with the electrode pattern trench by the imprinting is provided, the preparation method of electrode grid lines further includes:

The PVA thin film having a thickness of 25-125 μm is prepared with an electrostatic spinning method or a flatbed coating method.

Specifically, electrostatic spinning is a technique that uses an electrostatic force to stretch the polymer solution into nano- or micro-scale fibers for preparing polymer films.

Through the electrostatic spinning method or the flatbed coating method, the PVA thin film having the thickness of 25-125 μm can be prepared. This can ensure desirable performance requirement to realize desirable matching effect.

According to the embodiment of the present disclosure, preferably, the PVA thin film has a width of 200-800 μm, a breaking elongation of 20-60%, a tensile strength of 1-20 MPa, and a Shore A hardness of greater than 70 HS.

According to the embodiment of the present disclosure, preferably, the PVA thin film has a PVA content of greater than or equal to 90%, an average PVA alcoholysis degree of 86-90%, and a plasticizer content of 1-3%.

The PVA thin film using the above parameters can solve the problem that the PVA film in the market cannot meet a transfer printing function of the silver/copper paste for high softness, complex components of the plasticizer, and a large proportion of the plasticizer (10-20%).

According to transfer printing tests on three types of PVA thin films prepared in the laboratory and purchased from the market, the PVA thin film for transfer-printing the silver/copper paste has the following physicochemical properties:

PVA thin film for transfer printing of positive/negative electrode of solar cell

| Physicochemical parameters | Range | Deviation | Remarks |
|---|---|---|---|
| Thickness/μm | 25-125 | ±5 | |
| Width/mm | 200-800 | ±20 | |
| Light transmittance/% | ≥95 | ±1 | |
| Breaking elongation (longitudinal/transverse)/% | 20-60 | ±3 | |
| Tensile strength (longitudinal/transverse)/MPa | 1-20 | ±5 | |
| Shore A hardness/HS | >70 | ±1 | |
| Moisture content/% | 3-5 | ±1 | |
| PVA content/% | ≥90 | ±1 | |
| Plasticizer content/% | 1-3 | ±1 | |
| Ambient-temperature water solubility/min | 3 | ±0.1 | Temperature not higher than 25 °C |
| High-temperature water solubility/min | 2-5 | ±0.1 | Temperature not lower than 60 °C |
| Average PVA alcoholysis degree/% | 88% | ±2 | |

As can be known from the above table:

Unlike the PVA coating on the high-temperature-resistant thin film, the PVA thin film directly taken as the carrier can omit the film peeling step upon the transfer printing, reducing the cracking of the silicon wafer caused by film peeling. Accordingly, the PVA thin film is required to have a higher hardness. Besides, because of a greater thickness than the PVA coating on the high-temperature-resistant thin film, the PVA thin film in this solution is probably dissolved in water for a longer time at a high temperature, and probably for 2-5 min.

Certainly, when the flatbed coating is used, the process of the flatbed coating should be known to those skilled in the art.

Through parameters (including a heating temperature, a pressure, and a duration) of the precise hot-embossing machine and different molds for controlling the size and shape of the composite conductive grid line transfer-printed from the PVA thin film, the present disclosure reduces the ohmic loss of the electrode grid line 10. The PVA thin film is a biodegradable environment-friendly material, which is less harmful to the environment. The ambient-temperature water-soluble PVA thin film can greatly reduce the demolding cost. With the simple process, economic and environment-friendly material and equipment, and low process cost, the method is a new technique to change the printing situation of the silver electrode grid line 10 of the existing PV cell. The contact portion between the conductive paste and the silicon wafer dominates the contact resistance. Thus, the silver paste with better performance is selected to contact the silicon wafer, which can ensure the electrical conduction efficiency. The copper paste/copper paste can be taken as a replacement of the upper conductive portion to lower the cost. This can only be realized by the nanoimprinting and the transfer printing at present. Likewise, the upper conductive portion may also be in the shape of a trapezoid, a rectangle and the like. As shown in FIG. 8, it should be noted that the light grey represents the copper paste/carbon paste, and the dark grey represents the silver paste.

S2: Base material 9 is provided, a side of the transfer printing film in the step S1 having the composite conductive paste is aligned and bonded to the base material 9, and the first conductive paste 5 and the second conductive paste 8 are transfer-printed onto the base material 9 through an imprinting method with a preset process parameter. The process parameter of the imprinting method includes a pressure of 1-20 MPa, a temperature of 80-180 °C, and a duration of 0.5-10 min.

According to the embodiment of the present disclosure, preferably, the step S2 specifically includes:

The first conductive paste 5 and the second conductive paste 8 are transfer-printed onto the base material 9 via hot embossing by applying a uniform-codirectional pressure and preset temperature, while the first conductive paste 5 and the second conductive paste 8 are dried such that the first conductive paste and the second conductive paste are tightly bonded to a surface of the base material 9, without deformation. The base material 9 is one of monocrystalline silicon base material 9, polycrystalline silicon base material 9, perovskite base material 9, glass base material 9, and plastic base material 9.

The first conductive paste 5 and the second conductive paste 8 are transferred onto the base material 9 via the hot embossing by applying the uniform-codirectional pressure and preset temperature, while the first conductive paste 5 and the second conductive paste 8 are dried such that the first conductive paste and the second conductive paste are tightly bonded to the surface of the base material 9, without the deformation.

A side of the PVA thin film not coated with the silver paste is applied with the pressure and heated for drying. Due to adhesion between the PV paste and the silicon wafer, the PV paste can be transfer-printed onto the silicon wafer. The first conductive paste 5 and the second conductive paste 8 can be tightly bonded to the silicon wafer, thereby ensuring desirable transfer printing effect, and structural stability of the paste.

S3: The transfer printing film is removed to retain the first conductive paste 5 and the second conductive paste 8 on the base material 9.

According to the embodiment of the present disclosure, preferably, the step S3 specifically includes:

The transfer-printed base material 9 is immersed into water at 25-75 °C for cleaning, such that the PVA thin film is dissolved and separated, leaving a successfully transfer-printed pattern of the composite conductive paste to form a basic structure of the electrode grid line 10.

By dissolving and separating the base material 9, the pattern of the composite conductive paste can be retained on the base material 9 intact to realize desirable dissolution and separation. The base material 9 is a PVA thin film.

It should be noted that through adjustment on an alcoholysis degree of the PVA or blending modification, the water solubility of the PVA can be changed, such that the PVA is dissolved quickly at an ambient temperature. The PVA is insoluble in organic solvents such as gasoline, kerosene, plant oil, benzene, toluene, dichloroethane, carbon tetrachloride, acetone, ethyl acetate, methanol, and ethylene glycol. The PVA is incompatible and nonreactive with the binder in the silver paste.

S4: The first conductive paste 5 and the second conductive paste 8 are solidified or sintered on the base material 9 to form electrode grid lines 10 of the composite conductive paste having a preset aspect ratio.

According to the embodiment of the present disclosure, preferably, the step S4 specifically includes:

The silicon wafer transfer-printed with the first conductive paste 5 and the second conductive paste 8 is placed into a high-temperature furnace, and the composite conductive paste is solidified or sintered. A temperature is 200-1000 °C, ensuring that the silver paste is solidified or sintered completely, and tightly bonded to the base material 9 to form the high-precision electrode grid lines 10 of the preset aspect ratio.

After solidified or sintered at the temperature, the first conductive paste 5 and the second conductive paste 8 can form the silver paste electrode grid lines 10 of the desired depth and width. Preferably, the silver paste electrode grid line 10 has the depth of 10 μm, and the width of 5 μm.

The preparation process of the high-resolution composite silver/copper paste transfer printing film based on the PVA carrier in the embodiment has the following beneficial effects:

1. High resolution: The method can realize the electrode pattern of the micrometer scale or even the nanometer scale, and has a higher resolution compared with the conventional screen printing, thereby improving the performance and efficiency of the PV cell.
2. Simple process: With the PVA carrier as the transfer printing carrier, the preparation process is relatively simple, and the operation is convenient, so the method is applicable to large-scale production.
3. Low cost: Since the PVA material has a low cost, and the method can reduce the waste material, such the material waste is reduced, and the production cost is lowered. Meanwhile, compared with a solution in which the silver paste is used as the whole conductive path, by adding the copper paste, the method can greatly lower the cost without compromising the conductive performance.
4. High adhesion: The PVA exhibits no reactivity and weak adhesion to the binder and the solvent of the silver paste, and can be effectively taken as an ideal carrier of the transfer printing of the silver paste, such that the silver paste and the silicon wafer are tightly bonded.
5. Efficient production: Compared with the screen printing, the method has higher production efficiency, and can meet requirements of the large-scale production to improve the production efficiency.
6. Environmental protection and sustainability: The PVA carrier is dissolved after cleaned by the ambient-temperature water, such that the method is environment-friendly and sustainable to reduce the impact on the environment.

7. In combination with the copper paste and the silver paste, while the conductive performance is ensured, the production cost is lowered.
8. With the PVA as the transfer printing carrier, the copper paste and the silver paste are transfer-printed effectively, ensuring that the copper/silver paste and the silicon wafer are tightly bonded.
9. With the precise hot-embossing machine and the mold, the method prepares the high-resolution electrode pattern to improve the performance and efficiency of the PV cell.
10. The PVA exhibits no reactivity and weak adhesion to the binder and the solvent of the copper paste and silver paste, and can be effectively taken as an ideal transfer printing carrier, such that the silver paste and the silicon wafer are tightly bonded.
11. Through processes such as hot embossing and drying, the copper/silver paste is applied and solidified or sintered on the PVA carrier accurately, ensuring the accuracy and stability of the electrode pattern.

The present disclosure further provides a PV cell, including the electrode grid lines 10 prepared with the above preparation method.

Further, the PV cell includes base material layer 13;

second conductive layer 12 provided on the base material layer 13 at intervals along a length direction of the base material layer 13; and first conductive layer 11 connected to the second conductive layer 12 along a thickness direction perpendicular to the base material layer 13.

A longitudinal section of the first conductive layer 11 is in the shape of one of an isosceles triangle, an isosceles trapezoid, an ellipse, a hexagon, a right trapezoid, or a rectangle. A longitudinal section of the second conductive layer 12 is in the shape of an isosceles trapezoid.

Further, a passivation coating is provided between the first conductive layer 11 and the second conductive layer 12. It is to be understood that a layer of passivation material, such as an aluminum oxide thin film or a transparent organic coating, is coated between the copper layer and the silver layer or on the silver layer, so as to prevent moisture or corrosive substances in the environment from entering the interface between the copper layer and the silver layer.

For the PV cell using the electrode grid lines 10 provided by the embodiment, the basic principle and the technical effect are the same as those in the above embodiment. For contents not described in the embodiment, please refer to the above corresponding contents.

The above are preferred embodiments of the present disclosure, but the protection scope of the present disclosure is not limited thereto. Therefore, all equivalent changes made in accordance with the structure, shape, and principle of the present disclosure shall fall within the protection scope of the present disclosure.

What is claimed is:

1. A preparation method of electrode grid lines, comprising the following steps:

S1: providing a substrate, and forming a polymer layer on the substrate;

S2: imprinting, on the polymer layer with a first mold, a first trench corresponding to a desired electrode pattern, applying first conductive paste onto the polymer layer, wherein the first conductive paste fully fills the first trench, and scraping off excess first conductive paste;

S3: providing a base material, covering the base material with the polymer layer, and transfer-printing the polymer layer and the first conductive paste onto the base material at a predetermined temperature and a predetermined pressure;

S4: peeling off the substrate from the polymer layer, and dissolving the polymer layer, leaving the first conductive paste adhered to the base material; and S5: solidifying or sintering the first conductive paste to form electrode grid lines.

2. The preparation method of the electrode grid lines according to claim 1, wherein the polymer layer has a thickness of 5-30 μm, and the electrode pattern has an aperture width of 3-10 μm.

3. The preparation method of the electrode grid lines according to claim 1, further comprising a step S20 between the step S2 and the step S3: providing a second mold, imprinting a second trench on the first conductive paste with the second mold, and drying the first conductive paste; and applying a second conductive paste onto the first conductive paste, wherein the second conductive paste fully fills the second trench, and scraping off excess second conductive paste.

4. The preparation method of the electrode grid lines according to claim 3, wherein a contact resistance of the second conductive paste is less than a contact resistance of the first conductive paste; and an electrical conductivity of the second conductive paste is greater than an electrical conductivity of the first conductive paste.

5. The preparation method of the electrode grid lines according to claim 3, wherein in the step S20, after the second trench is imprinted, the first conductive paste is dried at a temperature of 80-200 °C.

6. The preparation method of the electrode grid lines according to claim 1, wherein in the step S3, by applying a pressure of 1-20 MPa, and a temperature of 80-180 °C, the first conductive paste is bonded to the base material, or a second conductive paste is bonded to the base material.

7. The preparation method of the electrode grid lines according to claim 1, wherein in the step S4, the polymer layer is dissolved with ambient-temperature water, leaving the first conductive paste adhered to the base material, or leaving the first conductive paste and a second conductive paste adhered to the base material.

8. The preparation method of the electrode grid lines according to claim 1, wherein in the step S5, the first conductive paste is solidified or sintered at a temperature of 200-1000 °C to form the electrode grid lines, or the first conductive paste and a second conductive paste are solidified or sintered at a temperature of 200-1000 °C to form the electrode grid lines.

9. The preparation method of the electrode grid lines according to claim 1, wherein a width of the first trench is the same as a width of a second trench; and a ratio of a height of the first trench to a height of the second trench is 2:1 to 5:1;

the first trench and the second trench are hot-embossed, and a hot-embossing temperature is 80-180 °C; and a longitudinal section of each of the first trench and the second trench is in a shape of one of a triangle, a trapezoid, a rectangle, a rhombus, a semicircle, and a polygon.

10. The preparation method of the electrode grid lines according to claim 1, wherein a material of each of the first mold and a second mold is one of monocrystalline silicon, polycrystalline silicon, copper, nickel, copper-nickel alloy, nickel-iron alloy, iron-aluminum alloy, and aluminum alloy.

11. The preparation method of the electrode grid lines according to claim 1, wherein a glass transition temperature (Tg) of the polymer layer is 70-120 °C, and a material of the polymer layer is a water-soluble polymer material; and the water-soluble polymer material is one of polyvinyl alcohol (PVA), polyvinylpyrrolidone (PVP), polyethylene glycol (PEG), modified polyvinyl alcohol (MPVA), sodium polyacrylate (PAAS), polyvinyl alcohol-polyacrylic acid (PVA-PAA), and polyvinyl alcohol-polyacrylonitrile (PVA-PAN).

12. The preparation method of the electrode grid lines according to claim 1, wherein a material of the substrate comprises one of polyethylene terephthalate (PET), polyimide (PI), polyethylene terephthalate glycol (PETG), polycarbonate (PC), polypropylene (PP), and polyurethane (PU), and the substrate has a thickness of 25-200 μm.

13. The preparation method of the electrode grid lines according to claim 1, wherein the base material is one of a monocrystalline silicon base material, a polycrystalline silicon base material, a perovskite base material, a glass base material, and a plastic base material.

14. A photovoltaic (PV) cell, comprising the electrode grid lines prepared with the preparation method according to claim 1.

15. The PV cell according to claim 14, wherein an outer edge of the electrode grid line is in a shape of one of a triangle, a trapezoid, a rectangle, a rhombus, a semicircle, and a polygon; and the electrode grid line has an aspect ratio of 2:1.

* * * * *